United States Patent
Kimura et al.

(10) Patent No.: US 11,411,164 B2
(45) Date of Patent: Aug. 9, 2022

(54) PIEZOELECTRIC THIN FILM DEVICE

(71) Applicant: TDK Corporation, Tokyo (JP)

(72) Inventors: Junichi Kimura, Tokyo (JP); Yukari Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 427 days.

(21) Appl. No.: 16/695,618

(22) Filed: Nov. 26, 2019

(65) Prior Publication Data
US 2020/0176667 A1    Jun. 4, 2020

(30) Foreign Application Priority Data

Nov. 29, 2018   (JP) .............................. JP2018-223900

(51) Int. Cl.
*H01L 41/187*   (2006.01)
*H01L 41/08*    (2006.01)

(52) U.S. Cl.
CPC ........ *H01L 41/0815* (2013.01); *H01L 41/187* (2013.01)

(58) Field of Classification Search
CPC ...................................................... H01L 41/08
See application file for complete search history.

(56) References Cited

U.S. PATENT DOCUMENTS

| | | | |
|---|---|---|---|
| 2005/0218756 A1* | 10/2005 | Fujii | B41J 2/1628 310/358 |
| 2020/0274051 A1* | 8/2020 | Kimura | C23C 14/06 |
| 2021/0126185 A1* | 4/2021 | Kimura | H01L 41/183 |

FOREIGN PATENT DOCUMENTS

| | | | | |
|---|---|---|---|---|
| JP | 2004346336 A | * | 12/2004 | ............ C23C 14/06 |
| JP | 2019004184 A | * | 1/2019 | ........... B06B 1/0603 |
| JP | 2021086982 A | * | 6/2021 | |

OTHER PUBLICATIONS

Naik, Rajan S. et al., "Measurements of the Bulk, C-Axis Electromechanical Coupling Constant as a Function of AlN Film Quality," IEEE Transactions on Ultrasonics, Ferroelectrics, and Frequency Control, vol. 47, No. 1, Jan. 2000, pp. 292-296.

* cited by examiner

*Primary Examiner* — J. San Martin
(74) *Attorney, Agent, or Firm* — Faegre Drinker Biddle & Reath LLP

(57) ABSTRACT

A piezoelectric thin film device 10 includes a conductive layer 4 and a piezoelectric thin film 2 laminated directly on a surface of the conductive layer 4. The piezoelectric thin film 2 contains a plurality of crystalline grains having a wurtzite structure, a (001) plane of at least a part of the crystalline grains is oriented in a normal direction $D_N$ of the surface of the conductive layer 4, and a median diameter of the plurality of crystalline grains in a direction parallel to the surface of the conductive layer 4 is 30 nm or more and 80 nm or less.

8 Claims, 7 Drawing Sheets

PIEZOELECTRIC THIN FILM DEVICE

TECHNICAL FIELD

The present invention relates to a piezoelectric thin film device.

BACKGROUND

In recent years, MEMS (micro electro mechanical systems) have attracted attention. The MEMS are devices in which mechanical component parts, electronic circuits, and the like are integrated on one substrate by microfabrication techniques. A piezoelectric thin film is used in MEMS having a function such as a sensor, a filter, a harvester, and an actuator. When manufacturing the MEMS using the piezoelectric thin film, a lower electrode layer, a piezoelectric thin film, and an upper electrode layer are laminated on a substrate such as silicon and sapphire. After passing through post-processing such as subsequent microfabrication, patterning, and etching, the MEMS having arbitrary characteristics is obtained. It is possible to achieve improvement in characteristic and reduction in size of a piezoelectric thin film device such as MEMS by selecting the piezoelectric thin film having an excellent piezoelectric property. The piezoelectric property of the piezoelectric thin film is evaluated based on, for example, a positive piezoelectric constant (piezoelectric strain constant) d and a piezoelectric output coefficient g. g is equal to $d/\varepsilon\varepsilon_0\varepsilon_r$. $\varepsilon_0$ is a dielectric constant of vacuum, and $\varepsilon_r$ is a relative dielectric constant of the piezoelectric thin film. The characteristics of the piezoelectric thin film device are improved by each increase of d and g.

As a piezoelectric composition forming the piezoelectric thin film, for example, PZT (lead zirconate titanate), $LiNbO_3$ (lithium niobate), AlN (aluminum nitride), ZnO (zinc oxide), CdS (cadmium sulfide), and the like are known.

PZT and $LiNbO_3$ have a perovskite structure. d of the piezoelectric thin film having the perovskite structure is relatively large. However, when the piezoelectric thin film has the perovskite structure, d is likely to decrease as a thickness of the piezoelectric thin film decreases. Therefore, the piezoelectric thin film having the perovskite structure is unsuitable for microfabrication. In addition, $\varepsilon_r$ of the piezoelectric thin film having the perovskite structure is relatively large, and thus, g of the piezoelectric thin film having the perovskite structure tends to be relatively small.

On the other hand, AlN, ZnO and CdS have a wurtzite structure. d of the piezoelectric thin film having the wurtzite structure is smaller than d of the piezoelectric thin film having the perovskite structure. However, $\varepsilon_r$ of the piezoelectric thin film having the wurtzite structure is relatively small, and thus, the piezoelectric thin film having the wurtzite structure can have g that is larger than that of the piezoelectric thin film having the perovskite structure. Therefore, the piezoelectric composition having the wurtzite structure is a promising material for the piezoelectric thin film device required to have large g. (Refer to the following Non Patent Literature 1.)

Non Patent Literature 1
Rajan S. Naik et al., IEEE TRANSACTIONS ON ULTRASONICS, FERROELECTRICS AND FREQUENCY CONTROL, 2000, vol. 47, p. 292-296

SUMMARY

Problems to be Solved by the Invention

A crystal orientation in which a piezoelectric property of a piezoelectric thin film having a wurtzite structure are developed is [001] of the wurtzite structure. That is, when the (001) plane of the wurtzite structure is oriented, the piezoelectric thin film can have an excellent piezoelectric property. However, a residual stress in the piezoelectric thin film having the orientation of (001) plane is larger than a residual stress in a piezoelectric thin film in which the orientation of a crystal plane is random. The large residual stress in the piezoelectric thin film causes a crack in the piezoelectric thin film. The piezoelectric property and insulating property of the piezoelectric thin film are impaired due to the crack formed in the piezoelectric thin film. Therefore, it is necessary to reduce the residual stress in the piezoelectric thin film having the wurtzite structure in order to achieve a high yield rate of the piezoelectric thin film device.

The present invention has been made in view of the above circumstances, and an object thereof is to provide a piezoelectric thin film device with a reduced residual stress of a piezoelectric thin film.

Means for Solving the Problems

A piezoelectric thin film device according to one aspect of the present invention comprises a conductive layer and a piezoelectric thin film directly laminated on a surface of the conductive layer, wherein the piezoelectric thin film contains a plurality of crystal grains having a wurtzite structure, a (001) plane of at least a part of the crystal grains is oriented in a normal direction of the surface of the conductive layer, and a median diameter of the plurality of crystal grains in a direction parallel to the surface of the conductive layer is 30 nm or more and 80 nm or less.

At least a part of the crystalline grains may be columnar crystals extending along the normal direction of the surface of the conductive layer.

An area fraction V of the crystalline grains may be defined by the following Formula 1, h, k, and l in the following Formula 1 may be Miller indices of the wurtzite structure, $\Sigma I_{(h00)}$ in the following Formula 1 may be a sum of intensities $I_{(h00)}$ of diffracted X-rays derived from a (h00) plane of the wurtzite structure, $\Sigma I_{(h00)}$ in the following Formula 1 may be a sum of intensities $I_{(hk0)}$ of diffracted X-rays derived from a (hk0) plane of the wurtzite structure, $\Sigma I_{(hk0)}$ in the following Formula 1 may be a sum of intensities of diffracted X-rays derived from all crystal planes of the wurtzite structure, $I_{(h00)}$, $I_{(hk0)}$, and $I_{(hkl)}$ in the following Formula 1 may be intensities of in-plane diffracted X-rays of a surface of the piezoelectric thin film, and the surface of the piezoelectric thin film may be parallel to the surface of the conductive layer, and the area fraction V may be 90% or more and 100% or less.

[Formula 1]

$$V = \left(2 \times \frac{\Sigma I_{(h00)} + \Sigma I_{(hk0)}}{\Sigma I_{(hkl)}} - 1\right) \times 100 \quad (1)$$

An absolute value of a lattice mismatch degree between the conductive layer and the piezoelectric thin film may be 0% or more and 6% or less.

An arithmetic average roughness Ra of the surface of the piezoelectric thin film may be 0.1 nm or more and 5.0 nm or less.

The piezoelectric thin film may be only aluminum nitride or aluminum nitride including an additive element.

The piezoelectric thin film may be only zinc oxide or zinc oxide including an additive element.

The conductive layer may contain a plurality of conductive crystalline grains, and the crystalline grain contained in the piezoelectric thin film may be fainted on a surface of the conductive crystalline grain.

Effect of the Invention

According to the present invention, provided is the piezoelectric thin film device with the reduced residual stress of the piezoelectric thin film.

DETAILED DESCRIPTION

Hereinafter, a preferred embodiment of the present invention will be described with reference to the drawings in accordance with cases. However, the present invention is not limited to the following embodiment. In the respective drawings, the same or equivalent components are denoted by the same reference signs. In the respective drawings, X, Y, and Z mean three coordinate axes orthogonal to each other.

Figure 1A:
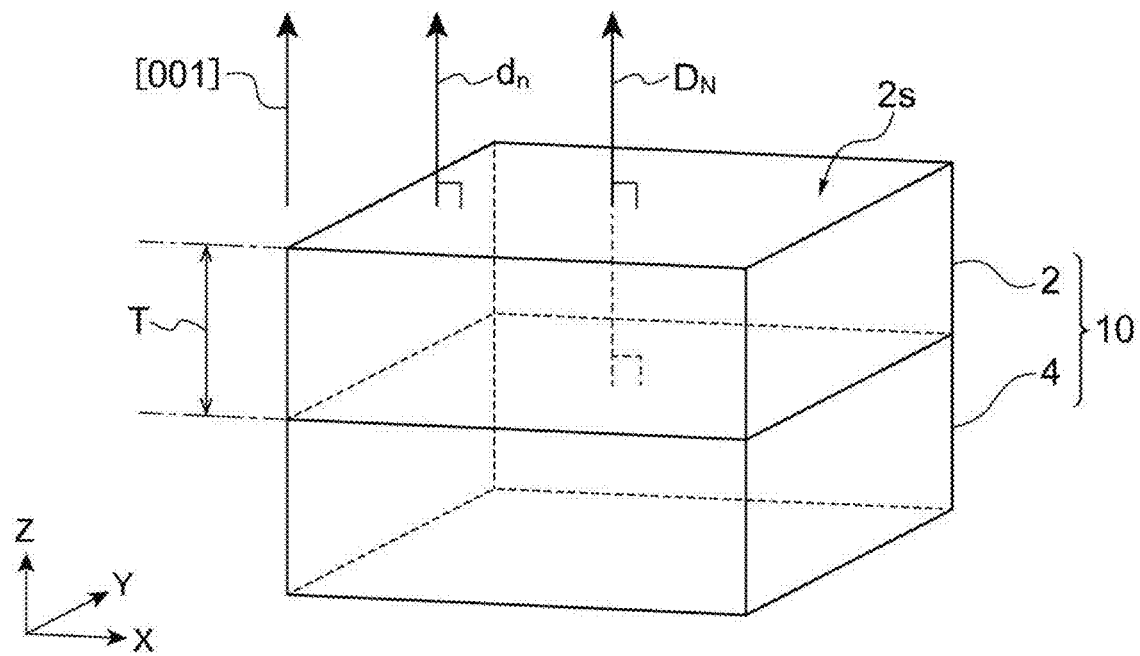
FIG. 1A is a schematic perspective view of a piezoelectric thin film device 10 according to one embodiment of the present invention.
Figure 4:
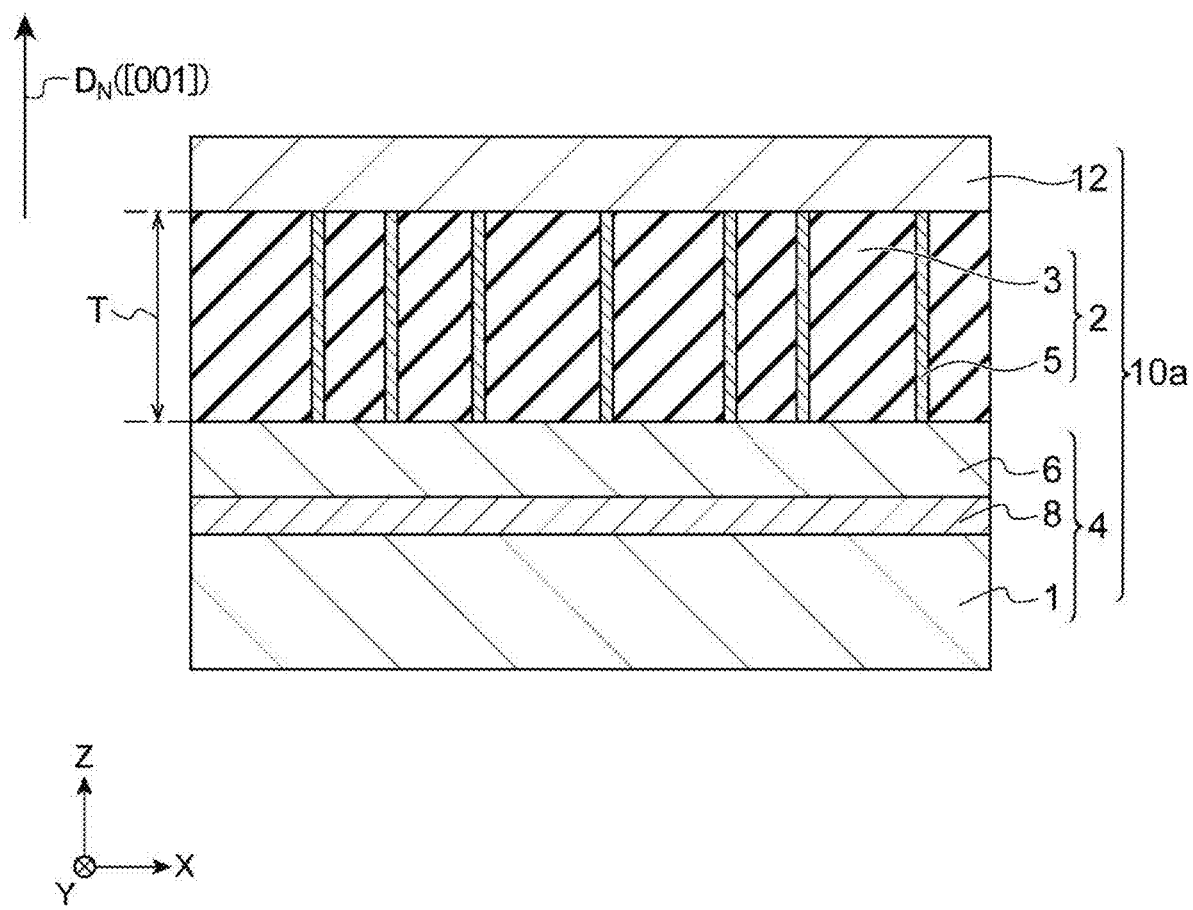
FIG. 4 is a schematic cross section of a piezoelectric thin film device 10a according to one embodiment of the present invention, and the cross section is parallel to the normal direction $D_N$ of the surface of the conductive layer 4.

As shown in FIG. 1A, a piezoelectric thin film device 10 according to the present embodiment includes a conductive layer 4 and a piezoelectric thin film 2 directly laminated on a surface of the conductive layer 4. The surface of the conductive layer 4 on which the piezoelectric thin film 2 is laminated has conductivity. The entire conductive layer 4 may have conductivity. The conductive layer 4 may include a plurality of layers. For example, as shown in FIG. 4, the conductive layer 4 may comprise a substrate 1, an adhesion layer 8 directly laminated on a surface of the substrate 1, and a first electrode layer 6 directly laminated on a surface of the adhesion layer 8, and the piezoelectric thin film 2 may be directly laminated on a surface of the first electrode layer 6. That is, the piezoelectric thin film device 10a, which is a modification of the piezoelectric thin film device 10, may comprise the substrate 1, the adhesion layer 8 directly overlapping the substrate 1, the first electrode layer 6 directly overlapping the adhesion layer 8, the piezoelectric thin film 2 directly overlapping the first electrode layer 6, and a second electrode layer 12 directly overlapping the piezoelectric thin film 2. The first electrode layer 6 may be rephrased as a lower electrode layer. The second electrode layer 12 may be rephrased as an upper electrode layer. However, the piezoelectric thin film device 10a does not necessarily comprise the second electrode layer 12. For example, a piezoelectric thin film device which does not include a second electrode layer may be supplied as a product to a manufacturer of an electronic device, and then, the second electrode layer may be added to the piezoelectric thin film device in the manufacturing process of the electronic device.

Figure 2A:
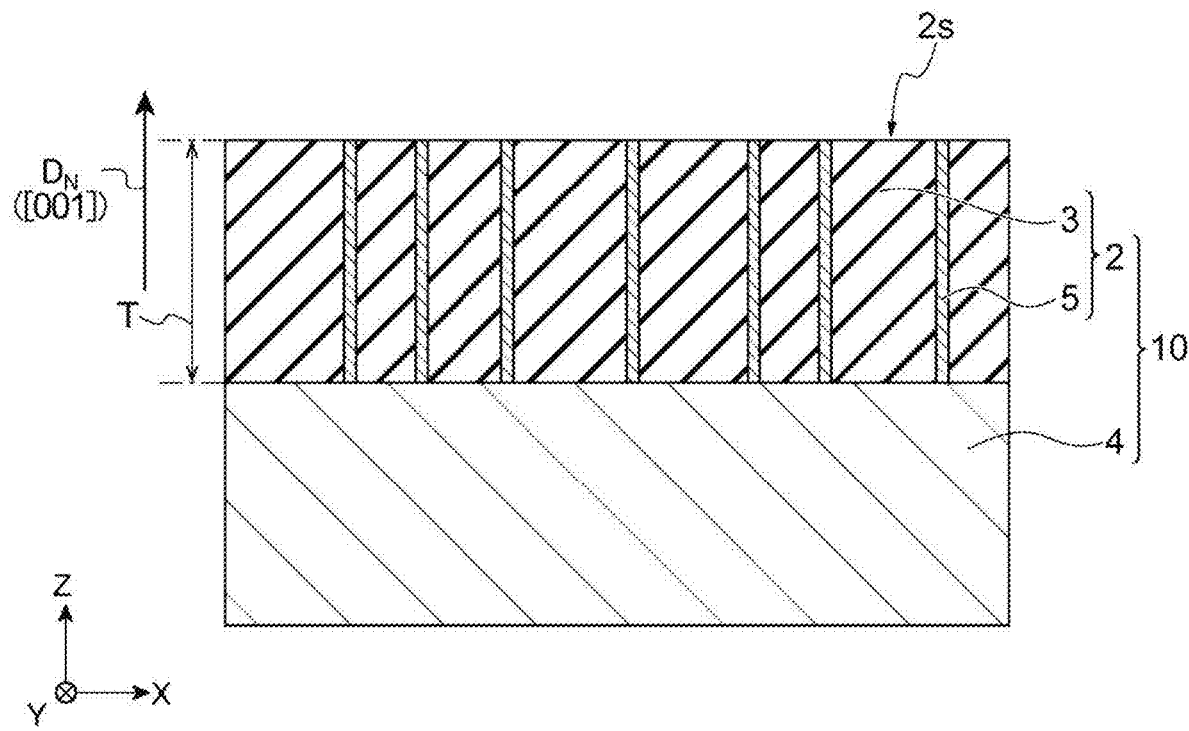
FIG. 2A is a schematic cross section of the piezoelectric thin film device 10, and the cross section is parallel to a normal direction $D_N$ of a surface of a conductive layer 4.
Figure 2B:
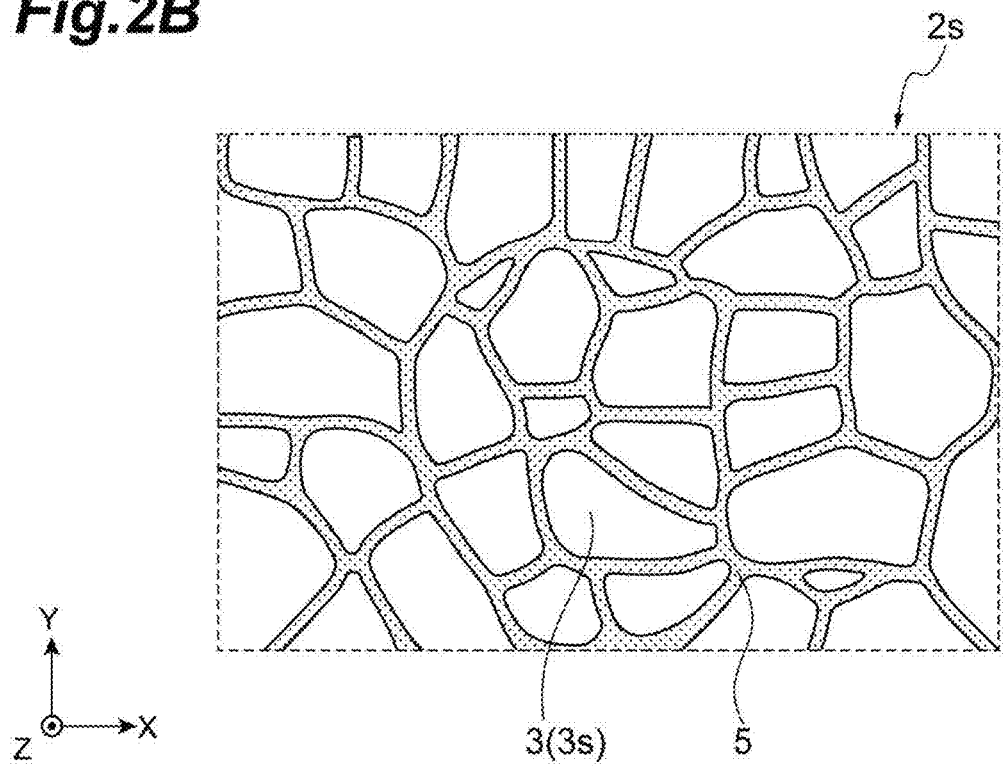
FIG. 2B is a schematic view of a surface 2s of a piezoelectric thin film 2 provided in the piezoelectric thin film device 10, and the surface 2s is perpendicular to the normal direction $D_N$ of the surface of the conductive layer 4.

As shown in FIG. 2A and FIG. 2B, the piezoelectric thin film 2 contains a plurality of crystalline grains 3 having a wurtzite structure. In other words, each of the crystalline grains 3 contains a piezoelectric composition having a wurtzite structure. The crystalline grains 3 having the wurtzite structure are sometimes described as "piezoelectric crystalline grains". Each of the crystalline grains 3 may be a single crystal or a polycrystal. A grain boundary phase 5 may be interposed between the plurality of crystalline grains 3. A part or all of the grain boundary phase 5 may penetrate the piezoelectric thin film 2 along a normal direction $D_N$ of the surface of the conductive layer 4.

Figure 1B:
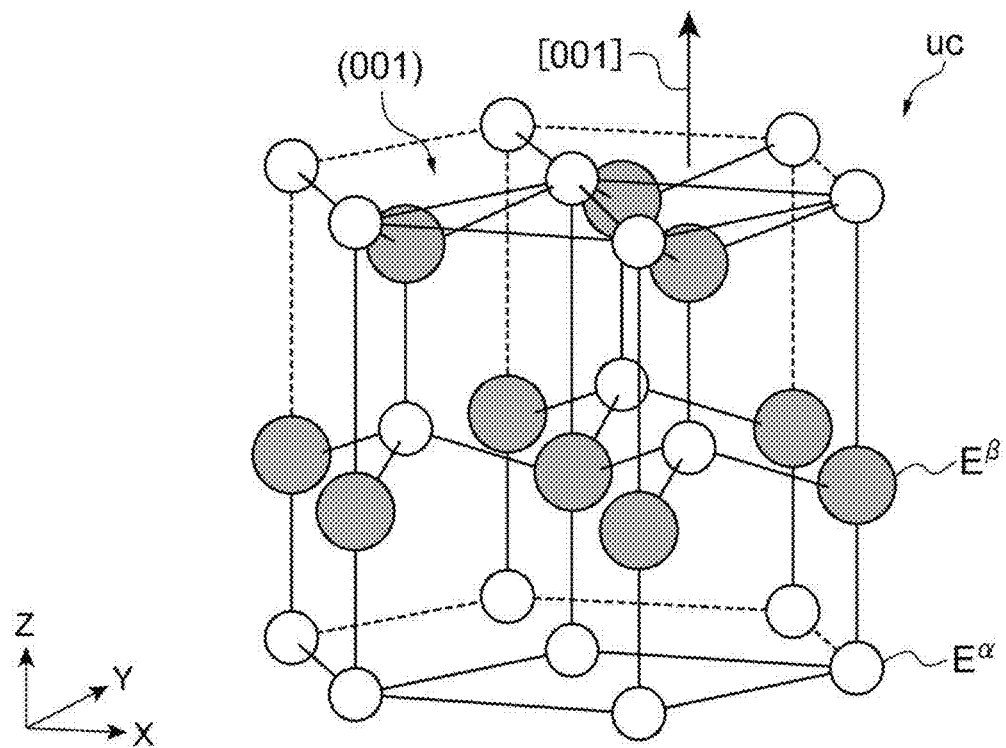
FIG. 1B is a schematic perspective view of a unit cell uc of a wurtzite structure.

A unit cell uc of the wurtzite structure is shown in FIG. 1B. A piezoelectric composition having the wurtzite structure may include at least two types of elements (element $E^\alpha$ and element $E^\beta$). The piezoelectric composition having the wurtzite structure may be expressed by $E^\alpha E^\beta$. For example, $E^\alpha$ may be Al (aluminum), $E^\beta$ may be N (nitrogen), and $E^\alpha E^\beta$ may be AlN (aluminum nitride). $E^\alpha$ may be Zn (zinc), $E^\beta$ may be O (oxygen), and $E^\alpha E^\beta$ may be ZnO (zinc oxide). A part of $E^\alpha$ may be replaced by another additive element. A part of $E^\beta$ may be replaced by another additive element. Details of a composition of the piezoelectric composition having the wurtzite structure will be described later.

The (001) plane of at least a part of the crystalline grains 3 is oriented in the normal direction $D_N$ of the surface of the conductive layer 4. Preferably, the (001) planes of all the crystalline grains 3 may be oriented in the normal direction $D_N$ of the surface of the conductive layer 4. In other words, the (001) plane(s) of a part or all of the crystalline grains 3 may be substantially perpendicular to the normal direction $D_N$ of the surface of the conductive layer 4. The (001) plane(s) of a part or all of the crystalline grains 3 may be substantially parallel to the surface of the conductive layer 4. The crystal orientation(s) [001] of a part or all of the crystalline grains 3 may be substantially parallel to the normal direction $D_N$ of the surface of the conductive layer 4. The (001) plane of the crystalline grain 3 corresponds to a hexagonal crystal plane in the unit cell uc. The normal direction $D_N$ of the surface of the conductive layer 4 is the normal direction $D_N$ of the surface on which the piezoelectric thin film 2 is directly laminated. The normal direction $D_N$ may be rephrased as a thickness direction (Z-axis direction) of the conductive layer 4. A crystal plane of the crystalline grain 3 whose plane index is not equivalent to (001) is sometimes described as a "non-(001) plane". The non-(001) plane is, for example, a (100) plane or a (101) plane. The crystalline grain 3 in which the non-(001) plane is oriented in the normal direction $D_N$ of the surface of the conductive layer 4 hardly contributes to a piezoelectric property of the piezoelectric thin film 2. The (001) plane of the crystalline grain 3 having the wurtzite structure may be described as a (0001) plane.

A crystal orientation in which the piezoelectric property of the piezoelectric thin film 2 is developed is [001] of the wurtzite structure. Therefore, the piezoelectric thin film 2 can have the excellent piezoelectric property as the (001) plane(s) of a part or all of the crystalline grains 3 is(are) oriented in the normal direction $D_N$ of the surface of the conductive layer 4. For the same reason, the (001) plane(s) of a part or all of the crystalline grains 3 may be oriented in the normal direction $d_n$ of a surface 2s of the piezoelectric thin film 2. In other words, the (001) plane(s) of a part or all of the crystalline grains 3 may be substantially perpendicular to a normal direction $d_n$ of the surface 2s of the piezoelectric thin film 2. The (001) plane(s) of a part [001] or all of the crystalline grains 3 may be substantially parallel to the surface 2s of the piezoelectric thin film 2. The crystal orientation(s) of a part or all of the crystalline grains 3 may be substantially parallel to the normal direction $d_n$ of the surface 2s of the piezoelectric thin film 2. The surface 2s of the piezoelectric thin film 2 is a plane substantially parallel to the surface of the conductive layer 4, and the surface 2s of the piezoelectric thin film 2 is substantially perpendicular to the normal direction $D_N$ of the surface of the conductive layer 4. That is, the normal direction $d_n$ of the surface 2s of the piezoelectric thin film 2 is substantially parallel to the normal direction $D_N$ of the surface of the conductive layer 4. The normal direction $d_n$ of the surface of the piezoelectric thin film 2 may be rephrased as a thickness direction (Z-axis direction) of the piezoelectric thin film 2. The crystal orientation [001] of the crystalline grain 3 may be rephrased as a polarization direction of the piezoelectric thin film 2. The crystalline grain 3 in which the (001) plane is oriented in the normal direction $D_N$ or the normal direction $d_n$ is sometimes described as a "(001)-oriented crystalline grain".

A median diameter D50 of the plurality of crystalline grains 3 in the direction parallel to the surface of the conductive layer 4 is 30 nm or more and 80 nm or less. When the median diameter of the crystalline grains 3 is 30 nm or more and 80 nm or less, a residual stress in the piezoelectric thin film 2 is reduced. The reduction of the residual stress suppresses cracks in the piezoelectric thin film 2. The suppression of the crack improves the piezoelectric property and the insulating property of the piezoelectric thin film 2. For the same reason, the median diameter of the crystalline grain 3 may be 35 nm or more and 70 nm or less.

A method of determining the median diameter of the crystalline grains 3 is as follows.

Figure 7A:
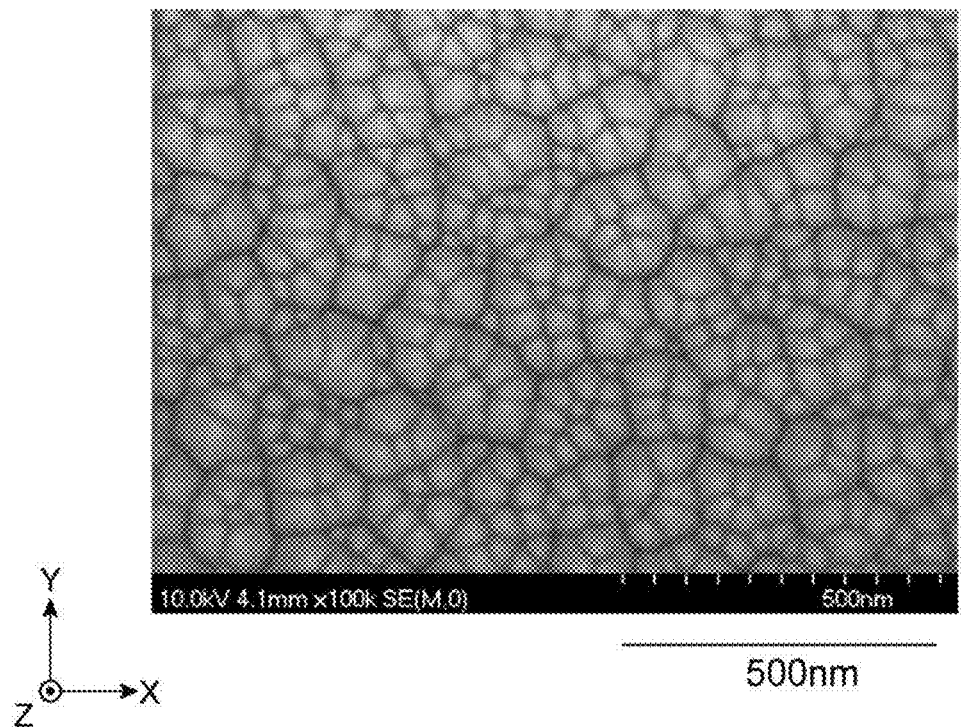
FIG. 7A is an image of a surface of the piezoelectric thin film of Example 1, and the surface is perpendicular to the normal direction of the surface of the conductive layer.
Figure 7B:
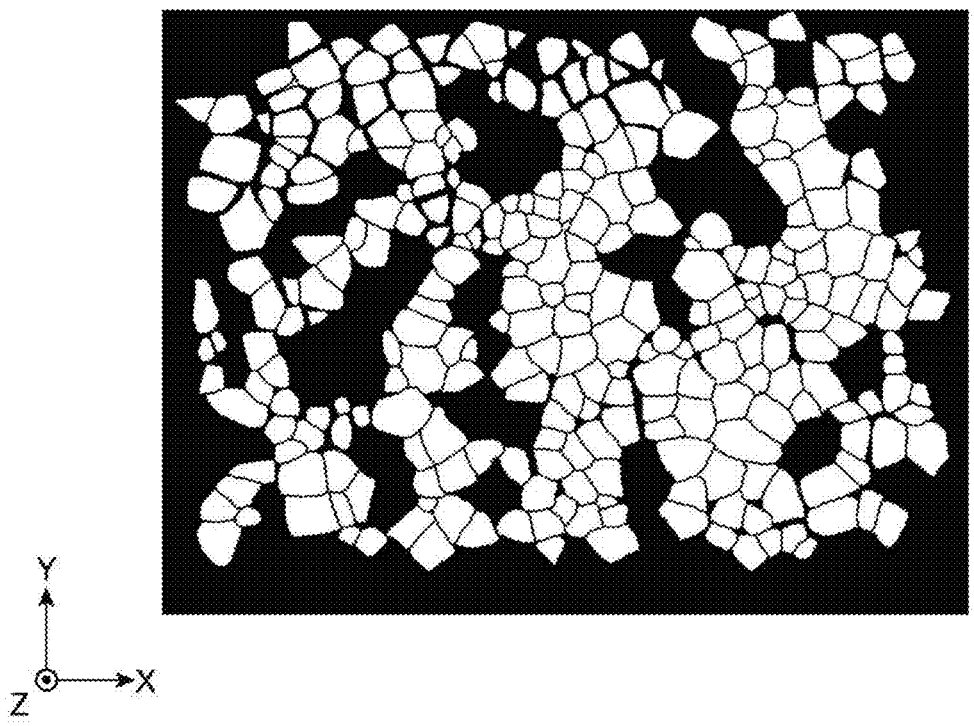
FIG. 7B is a binarized image of FIG. 7A.

The median diameter of the crystalline grain 3 is calculated from grain sizes d of the plurality of crystalline grains 3 in a direction (XY-plane direction) parallel to the surface of the conductive layer 4. The grain size d of each of the crystalline grains 3 is calculated from the area of a surface 3s of each of the crystalline grains 3 exposed to the surface 2s of the piezoelectric thin film 2. The surface 3s of each of the crystalline grains 3 exposed to the surface 2s of the piezoelectric thin film 2 is shown in FIG. 2B. The area of the surface 3s of each of the crystalline grains 3 is expressed by A. The grain size d (diameter) of each of the crystalline grains 3 is expressed by $(4A/\pi)^{1/2}$. $(4A/\pi)^{1/2}$ corresponds to a diameter (equivalent circle diameter) of a circle whose area is A. That is, the grain size d of each of the crystalline grains 3 is a Heywood diameter calculated from the area A of the surface 3s of each of the crystalline grains 3. An image of the surface 2s of the piezoelectric thin film 2 is taken by a scanning electron microscope (SEM) in order to measure the area A of the surface 3s of each of the crystalline grains 3. An example of the image of the surface 2s of the piezoelectric thin film 2 is shown in FIG. 7A. Subsequently, the image of the surface 2s of the piezoelectric thin film 2 is binarized. An example of the binarized image of the surface 2s of the piezoelectric thin film 2 is shown in FIG. 7B. A white portions shown in FIG. 7B correspond to the surfaces 3s of the crystalline grains 3 exposed to the surface 2s of the piezoelectric thin film 2. A black portions shown in FIG. 7B corresponds to the grain boundary phases 5. The area of one closed region (white region) surrounded by the grain boundary phase 5 is measured as the area A of the surface 3s of one crystalline grain 3. The crystalline grain 3 not clearly defined by the grain boundary phase 5 is excluded from measuring objects of the area A. That is, the crystalline grain 3 not clearly defined by the grain boundary phase 5 is included in the black portions shown in FIG. 7B. The binarization of the image of the surface 2s of the piezoelectric thin film 2 may be performed manually or by image analysis software. The measurement of the area A of the surface 3s of the crystalline grain 3 may be performed by image analysis software. The number N (number of samples) of the crystalline grains 3 whose area A is measured may be, for example, 300 or more and 500 or less.

Figure 3A:
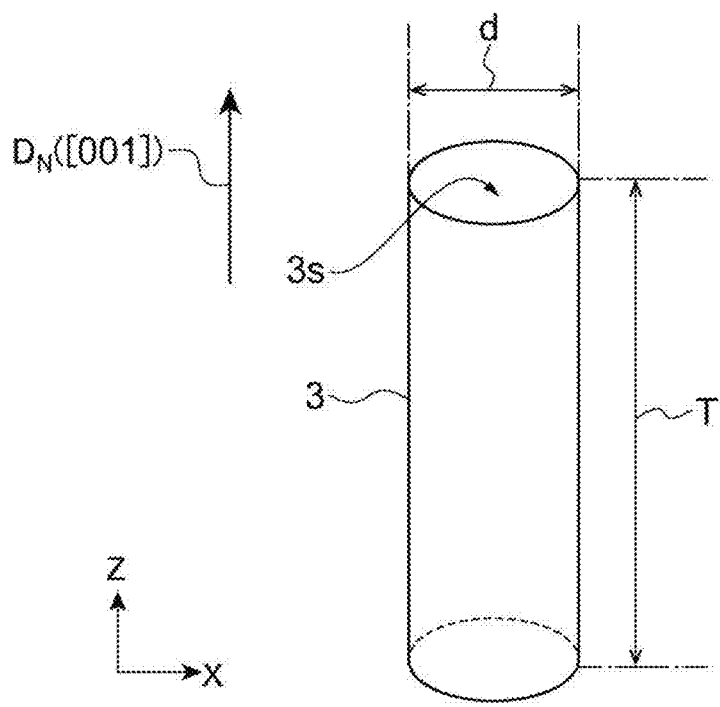
FIG. 3A is a schematic perspective view of crystalline grains 3 (columnar crystals) contained in the piezoelectric thin film 2.
Figure 3B:
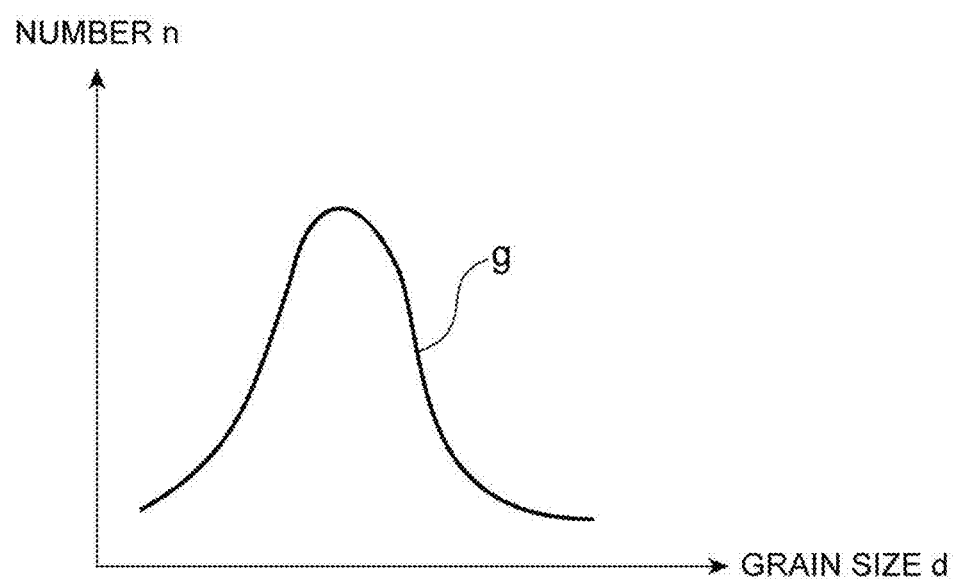
FIG. 3B shows a grain size distribution of a grain size of the plurality of crystalline grains 3 contained in the piezoelectric thin film 2.

A grain size distribution of the crystalline grains 3 is obtained from the grain sizes d of the n crystalline grains 3 calculated by the above method. An example of the grain size distribution of the crystalline grains 3 is shown in FIG. 3B. A grain size distribution g of the crystalline grains 3 is a number distribution (number-based grain size distribution). The median diameter D50 of the crystalline grains 3 is determined based on the grain size distribution g. Although the grain size distribution g shown in FIG. 3B is a frequency distribution, the grain size distribution may be an integrated distribution.

A mechanism by which the residual stress in the piezoelectric thin film 2 is reduced is as follows.

A grain boundary excess volume of the piezoelectric thin film 2 and the grain size d of the crystalline grains 3 contained in the piezoelectric thin film 2 are factors of the residual stress a in the piezoelectric thin film 2. The grain boundary excess volume of the piezoelectric thin film 2 is expressed by δ. δ may be defined, for example, as (vp−vs)/2s. vp is the volume of the piezoelectric thin film 2. vs is the volume of a single crystal (complete crystal) having the same composition as the piezoelectric thin film 2 and formed of the same number of atoms as the piezoelectric thin film 2. s is the area of the surface 2s of the piezoelectric thin film 2. The grain boundary excess volume δ of the piezoelectric thin film 2 means a free volume of the grain boundary phase 5 per unit area of the grain boundary phase 5 exposed to the surface 2s of the piezoelectric thin film 2. As the grain boundary excess volume δ of the piezoelectric thin film 2 increases, stress is likely to concentrate on the grain boundary phase 5, and the residual stress σ in the piezoelectric thin film 2 increases. On the other hand, the residual stress s in the piezoelectric thin film 2 decreases as the grain size d of the crystalline grains 3 included in the piezoelectric thin film 2 decreases. That is, the residual stress a in the piezoelectric thin film 2 is proportional to δ/d. Therefore, the residual stress a in the piezoelectric thin film 2 tends to decrease as the median diameter D50 of the crystalline grains 3 increases. In other words, the residual stress a in the piezoelectric thin film 2 tends to decrease as a volume ratio of the grain boundary phase 5 in the piezoelectric thin film 2 decreases. Since the median diameter D50 of the crystalline grains 3 is 30 nm or more and 80 nm or less when the piezoelectric thin film 2 includes the plurality of crystalline grains 3 having the wurtzite structure and the (001) plane of at least a part of the crystalline grains 3 is oriented in the normal direction $D_N$ of the surface of the conductive layer 4, the residual stress in the piezoelectric thin film 2 is reduced. When the median diameter of the crystalline grains 3 is smaller than 30 nm, it is difficult to sufficiently reduce the residual stress in the piezoelectric thin film 2. The range of the median diameter of the crystalline grain 3 in which the residual stress in the piezoelectric thin film 2 is reduced is the range that has been determined for the first time by the present inventors.

The technical scope of the present invention is not limited by the above mechanism.

A thickness T of the piezoelectric thin film 2 may be, for example, 0.1 μm or more and 30 μm or less. The thickness T of the piezoelectric thin film 2 may be substantially uniform. The thickness T of the piezoelectric thin film 2 may be regarded as a length of each of the crystalline grains 3 in the normal direction $D_N$ of the surface of the conductive layer 4.

At least a part of the crystalline grains 3 may be columnar crystal. All the crystalline grains 3 may be columnar crystals. As shown in FIG. 3A, the columnar crystal is defined as the crystalline grain 3 which extends along the normal direction $D_N$ of the surface of the conductive layer 4 and has an aspect ratio d/T of more than 0 and less than 1. Since the (001) plane of the columnar crystal is likely to be oriented in the normal direction $D_N$, the piezoelectric thin film 2 is likely to have the excellent piezoelectric property by including the columnar crystal. A median diameter D'50 of the columnar crystals is preferably 30 nm or more and 80 nm or less. When the median diameter of the columnar crystals is 30 nm or more and 80 nm or less, the residual stress in the piezoelectric thin film 2 is easily reduced. For the same reason, the median diameter of the columnar crystals may be 35 nm or more and 70 nm or less. Except that the median diameter D'50 of the columnar crystals is determined based only on the columnar crystals, a definition and determining method of the median diameter D'50 of the columnar crystals are the same as the definition and the determining method of the median diameter D50 of the crystalline grains 3. That is, the grain size d of the crystalline grain 3 having an aspect ratio d/T of 1 or more is excluded from the grain size distribution g in the determining method of the median diameter D'50 of the columnar crystals.

An area fraction V (unit: %) of the crystalline grain 3 is defined by the following Formula 1. In the following Formula 1, h, k, and l are Miller indices of the wurtzite structure. h is an integer of 0 or more and 3 or less. k is an integer of 0 or more and 2 or less. l is an integer of 0 or more and 6 or less. $\Sigma I_{(h00)}$ in the following Formula 1 is a sum of intensities $I_{(h00)}$ of diffracted X-rays derived from a (h00) plane of the wurtzite structure. $\Sigma I_{(hk0)}$ in the following Formula 1 is a sum of intensities $I_{(hk0)}$ of diffracted X-rays derived from a (hk0) plane of the wurtzite structure. $\Sigma I_{(hkl)}$ in the following Formula 1 is a sum of intensities of diffracted X-rays derived from all crystal planes of the wurtzite structure. $I_{(h00)}$, $I_{(hk0)}$, and $I_{(hkl)}$ are the intensities of in-plane diffracted X-rays of the surface 2s of the piezoelectric thin film 2. That is, $I_{(h00)}$, $I_{(hk0)}$, and $I_{(hkl)}$ are peak intensities of X-ray diffraction (XRD) pattern measured by in-plane diffraction on the surface 2s of the piezoelectric thin film 2. As described above, the surface 2s of the piezoelectric thin film 2 is substantially parallel to the surface of the conductive layer 4 on which the piezoelectric thin film 2 is laminated. The higher a ratio of (001)-oriented crystalline grains among all the crystalline grains 3 contained in the piezoelectric thin film 2 is, the higher the area fraction V is. When the (001) planes of all the crystalline grains 3 contained in the piezoelectric thin film 2 are parallel to the surface 2s of the piezoelectric thin film 2, only the diffracted X-rays derived from the (h00) plane and the (hk0) plane are detected in an in-plane direction of the surface 2s of the piezoelectric thin film 2, $\Sigma I_{(hkl)}$ is equal to $\Sigma I_{(h00)} + \Sigma I_{(hk0)}$. Therefore, when the (001) planes of all the crystalline grains 3 contained in the piezoelectric thin film 2 are parallel to the surface 2s of the piezoelectric thin film 2, the area fraction V is 100%. The area fraction V may be 90% or more and 100% or less. When the area fraction V is 90% or more, the residual stress in the piezoelectric thin film 2 is likely to decrease along with the increase of D50 or D'50. For the same reason, the area fraction V may be 95% or more and 100% or less, 96% or more and 100%, 97% or more and 100% or less, 98% or more and 100% or less, or 99% or more and 100% or less. Formula 1 is equivalent to the following Formula 1a.

[Formula 1]
$$V = \left(2 \times \frac{\Sigma I_{(h00)} + \Sigma I_{(hk0)}}{\Sigma I_{(hk1)}} - 1\right) \times 100 \tag{1}$$

[Formula 1a]
$$V = \left\{2 \times \left(\sum_h I_{(h00)} + \sum_{h,k} I_{(hk0)}\right) \div \sum_{h,k,1} I_{(hk1)} - 1\right\} \times 100 \tag{1a}$$

An absolute value of a lattice mismatch degree Data between the conductive layer 4 and the piezoelectric thin film 2 may be 0% or more and 6% or less. An absolute value of the lattice mismatch degree Δa/a may be 0% or more and 3.4% or less. The lattice mismatch degree Δa/a between the conductive layer 4 and the piezoelectric thin film 2 is defined by the following Formula 2.

[Formula 2]
$$\frac{\Delta a}{a} = \frac{a_{ele.} - a_{wurt.}}{a_{ele.}} \times 100 \tag{2}$$

In Formula 2, $a_{ele.}$ may be a lattice constant in an a-axis direction of the conductive layer 4 at a film formation temperature T° C. (for example, 300° C.) of the piezoelectric thin film 2. For example, $a_{ele.}$ may be an interval between the (100) planes in the crystal structure of the conductive layer 4. $a_{ele.}$ may be rephrased as the lattice constant of the surface of the conductive layer 4 on which the piezoelectric thin film 2 is laminated. When the conductive layer 4 includes the first electrode layer 6 and the piezoelectric thin film 2 is laminated directly on the surface of the first electrode layer 6, $a_{ele.}$ may be a lattice constant of the first electrode layer 6. The lattice constant of the conductive layer 4 at the room temperature (27° C.) may be expressed by $a_{ele.0}$, and a thermal expansion coefficient of the conductive layer 4 may be expressed by $CTE_{ele}$. Alternatively, the lattice constant of the first electrode layer 6 at the room temperature (27° C.) may be expressed by $a_{ele.0}$, and a thermal expansion coefficient of the first electrode layer 6 may be expressed by $CTE_{ele.}$. $a_{ele.}$ T° C. is equal to $a_{ele.0}+CTE_{ele.}\times(T-27)$. $a_{wurt.}$ may be a lattice constant in the a-axis direction of the wurtzite structure of the piezoelectric thin film 2 at the film formation temperature (for example, 300° C.) of the piezoelectric thin film 2. For example, $a_{wurt.}$ may be an interval between the (100) planes in the wurtzite structure. A lattice constant of the wurtzite structure of the piezoelectric thin film 2 at the room temperature (27° C.) may be expressed by $a_{wurt.0}$. A thermal expansion coefficient of the piezoelectric thin film 2 may be expressed by $CTE_{wurt.}$. $a_{wurt.}$ at T° C. is equal to $a_{wurt.0}+CTE_{wurt.}\times(T-27)$.

The reason why the absolute value of the lattice mismatch degree Δa/a between the conductive layer 4 and the piezoelectric thin film 2 is preferably 0% or more and 6% or less is as follows.

As the absolute value of Data is reduced, the (001) plane of the crystalline grain 3 is likely to be oriented in the normal direction $D_N$ of the surface of the conductive layer 4, and the area fraction V of the crystalline grain 3 is likely to increase. That is, fluctuations in the orientation of the (001) planes of the crystalline grains 3 are easily suppressed in the normal direction $D_N$ of the surface of the conductive layer 4, and the orientation of the non-(001) planes of the crystalline grains 3 in the normal direction $D_N$ is easily suppressed. As a result, the piezoelectric characteristics of the piezoelectric thin film 2 can be easily improved.

As the absolute value of Δa/a is reduced, the residual stress in the piezoelectric thin film 2 is easily reduced. As the residual stress is reduced, the crack in the piezoelectric thin film 2 can be easily suppressed, and the piezoelectric property and insulating property of the piezoelectric thin film 2 can be easily improved. The peeling of the piezoelectric thin film 2 from the first electrode layer 6 is easily suppressed by the suppression of cracks in the piezoelectric thin film 2. For example, when the conductive layer 4 includes the substrate 1 and the first electrode layer 6, the piezoelectric thin film 2 is directly laminated on the surface of the first electrode layer 6, the substrate 1 is the single crystal of silicon, and the piezoelectric thin film 2 is aluminum nitride, the residual stress a (unit: GPa) in the piezoelectric thin film 2 is expressed by the following Formula 3.

[Formula 3]
$$\sigma = \frac{E}{1+v}[\varepsilon_{misfit}+\varepsilon_{thermal}] = \frac{E}{1+v}\left[\frac{\Delta a}{a}+(\alpha_{AlN}-\alpha_{Si})\Delta T\right] \quad (3)$$

E in the Formula 3 is a Young's modulus (unit: GPa) of the piezoelectric thin film 2. v is a Poisson's ratio of the piezoelectric thin film 2. $\varepsilon_{misfit}$ is a factor derived from the lattice mismatch degree between the first electrode layer 6 and the piezoelectric thin film 2. $\varepsilon_{thermal}$ is a factor derived from a difference in thermal expansion coefficient between the substrate 1 and the piezoelectric thin film 2. Δa/a is the above-described lattice mismatch degree. $\alpha_{AlN}$ is a thermal expansion coefficient of the piezoelectric thin film 2 (AlN), which is about $4.2\times10^{-6}$/° C. $\alpha_{Si}$ is a thermal expansion coefficient of the substrate 1 (Si) and is about $3.0\times10^{-6}$/° C. As shown in Formula 3, the residual stress σ decreases by the decrease of the lattice mismatch degree. In addition, the residual stress a decreases by the decrease of the difference in thermal expansion coefficient between the substrate 1 and the piezoelectric thin film 2. When the first electrode layer 6 is tungsten and the piezoelectric thin film 2 is formed at 300° C., $\varepsilon_{misfit}$ is about 2.52% and $\varepsilon_{thermal}$ is $3.28\times10^{-4}$%. These numerical values suggest that the lattice mismatch degree is the dominant factor for the residual stress a between the lattice mismatch degree and the difference in thermal expansion coefficient.

As the ratio of (001)-oriented crystalline grains among all the crystalline grains 3 contained in the piezoelectric thin film 2 is higher, the surface 2s of the piezoelectric thin film 2 is the smoother. In other words, the surface 2s of the piezoelectric thin film 2 is smoother as the area fraction V of the crystalline grain 3 is higher. On the other hand, the surface 2s of the piezoelectric thin film 2 is rougher as the number of the crystalline grains 3 in which the non-(001) planes are oriented in the normal direction $D_N$ of the surface of the conductive layer 4 is larger. As the absolute value of the lattice mismatch degree Δa/a between the conductive layer 4 and the piezoelectric thin film 2 is smaller, the surface 2s of the piezoelectric thin film 2 is smoother.

As the surface 2s of the piezoelectric thin film 2 is smooth, an insulation resistance of the piezoelectric thin film 2 is likely to increase. The reason thereof is as follows. When the lattice mismatch degree between the conductive layer 4 and the piezoelectric thin film 2 is large, the piezoelectric thin film 2 is likely to be formed by Volmer-Weber island growth. As a result, the surface of the piezoelectric thin film 2 becomes rough. When an electric field is applied to the piezoelectric thin film 2 having the rough surface, the electric field distribution on the surface of the piezoelectric thin film 2 is likely to be biased, and the electric field strength at a local portion (for example, a protrusion) of the piezoelectric thin film 2 is likely to be excessively high. As a result, dielectric breakdown in the piezoelectric thin film 2 is likely to occur. On the other hand, when the lattice mismatch degree between the conductive layer 4 and the piezoelectric thin film 2 is small, the piezoelectric thin film 2 is likely to be formed by Frank-Van der Merwe layer-by-layer growth. As a result, the surface of the piezoelectric thin film 2 is likely to be smooth. When an electric field is applied to the piezoelectric thin film 2 having the smooth surface, the electric field distribution on the surface of the piezoelectric thin film 2 is likely to be uniform. As a result, dielectric breakdown in the piezoelectric thin film 2 hardly occurs.

As the surface 2s of the piezoelectric thin film 2 is rougher, it is difficult for the surface 2s of the piezoelectric thin film 2 to be uniformly covered by the second electrode layer 12, and the thickness of the second electrode layer 12 is not uniform. As a result, an impedance of the second electrode layer 12 is likely to change, and a dielectric loss of the piezoelectric thin film device 10 is likely to change. In addition, a relatively thin portion in the second electrode layer 12 is likely to be broken due to the occurrence of the piezoelectric phenomenon of the piezoelectric thin film 2. That is, a crack is likely to be formed in the relatively thin portion of the second electrode layer 12. As a result, the valid area of the second electrode layer 12 is likely to change, and the output of the piezoelectric thin film device 10 is hardly stabilized over time.

For the above reasons, the surface 2s of the piezoelectric thin film 2 is preferably smooth. In other words, an arithmetic average roughness Ra of the surface 2s of the piezoelectric thin film 2 is preferably small. For example, the arithmetic average roughness Ra of the surface 2s of the piezoelectric thin film 2 may be 0.1 nm or more and 5.0 nm or less, or 1.4 nm or more and 4.4 nm or less. The arithmetic average roughness Ra of the surface 2s of the piezoelectric thin film 2 is an arithmetic average roughness of a back surface of the surface of the piezoelectric thin film 2, the back surface facing the conductive layer 4. The arithmetic average roughness Ra may be measured by atomic force microscopy (AFM). Even if the arithmetic average roughness Ra is out of the above range, it is possible to achieve the effects of the present invention.

Figure 5:
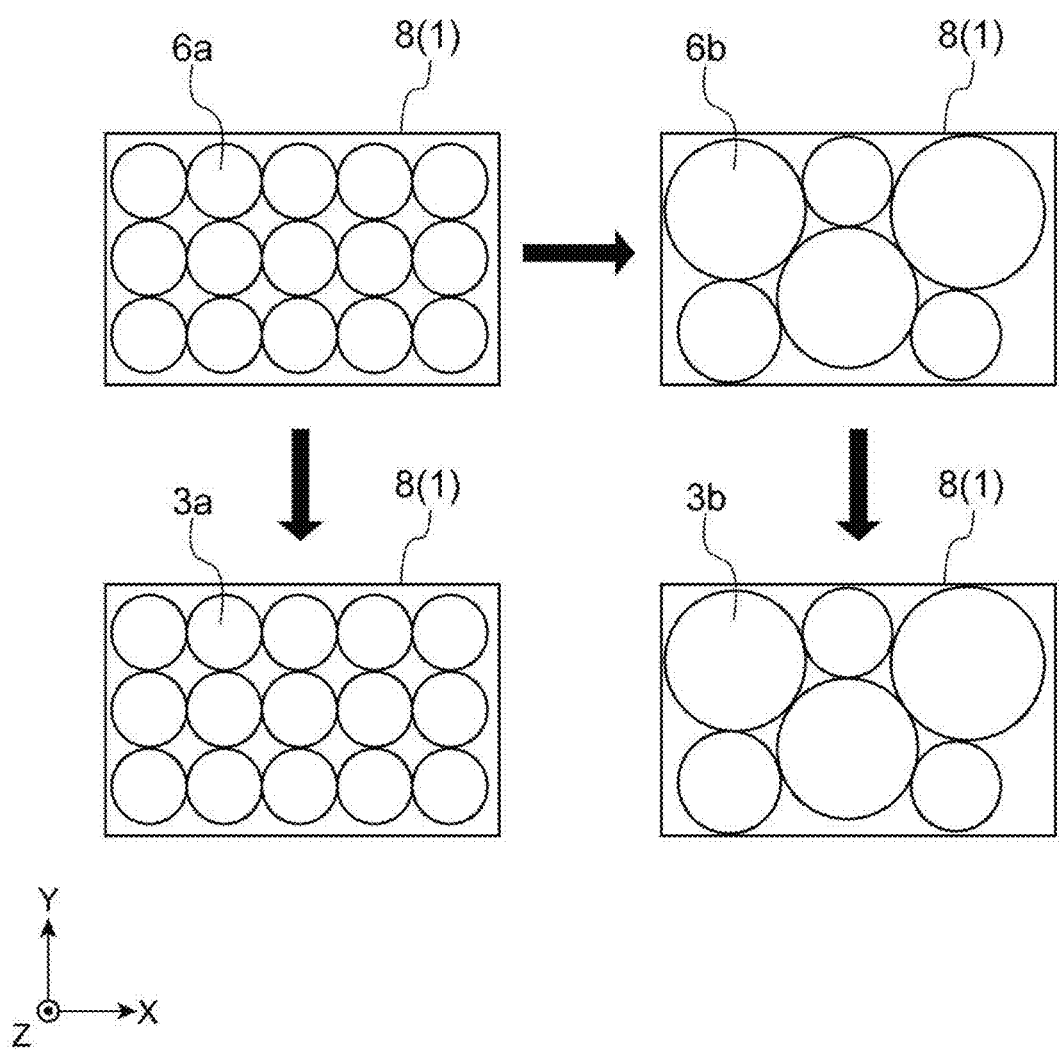
FIG. 5 is a schematic view illustrating a relationship between a grain size of a crystalline grain contained in the piezoelectric thin film and a grain size of a conductive crystalline grain contained in the conductive layer.

The conductive layer 4 may include a plurality of conductive crystalline grains, and the piezoelectric crystalline grains 3 contained in the piezoelectric thin film 2 may be formed on the surface of the conductive crystalline grain. For example, when the conductive layer 4 includes the substrate 1, the adhesion layer 8, and the first electrode layer 6 and the piezoelectric thin film 2 is directly laminated on the surface of the first electrode layer 6, the first electrode layer 6 may be formed of a plurality of conductive crystalline grains 6a as shown in FIG. 5. The piezoelectric crystalline grains 3 may be formed on the surfaces of the conductive crystalline grains 6a such that one piezoelectric crystalline grain 3a covers the entire surface of one conductive crystalline grain 6a. The piezoelectric crystalline grains 3a may be formed on the surfaces of the conductive crystalline grains 6a such that the plurality of piezoelectric crystalline grains 3a cover the entire surface of one conductive crystalline grain 6a.

The annealing of the first electrode layer 6 causes the plurality of conductive crystalline grains 6a to agglomerate and grow into the larger conductive crystalline grains 6b. A grain size d of a piezoelectric crystalline grain 3b covering a surface of the large conductive crystalline grain 6b tends to be larger than a grain size d of the piezoelectric crystalline grain 3a covering the small conductive crystalline grain 6a. That is, the grain size d and the median diameter D50 of the piezoelectric crystalline grain 3 are also likely to increase as the grain size of the conductive crystalline grain increases.

It is possible to control the median diameter D50 of the piezoelectric crystalline grain 3 by adjusting the grain size of the conductive crystalline grain due to the above reasons. As an annealing temperature of the first electrode layer 6 is higher, the grain size and the median diameter of the conductive crystalline grain are likely to increase, and the grain size d and median diameter D50 of the piezoelectric crystalline grain 3 are also likely to increase. As an annealing time of the first electrode layer 6 is longer, the grain size and the median diameter of the conductive crystalline grain are likely to increase, and the grain size d and median diameter D50 of the piezoelectric crystalline grain 3 are also likely to increase. The annealing temperature may be a temperature at which the conductive crystalline grains constituting the first electrode layer 6 agglomerate and grow. The annealing temperature is not limited since the temperature at which the conductive crystalline grains agglomerate and grow varies depending on the composition of the first electrode layer 6. The annealing atmosphere may be, for example, a simple substance of Ar (argon), a mixed gas of Ar and $O_2$ ((oxygen), or a mixed gas of Ar and $N_2$ (nitrogen). A method of controlling the grain size of the conductive crystalline grain is not limited to the annealing of the first electrode layer 6. When the first electrode layer 6 is directly laminated on the surface of the adhesion layer 8, a grain size of a conductive crystalline grain is also likely to increase as a grain size of a crystalline grain forming the adhesion layer 8 increases. Therefore, the grain size of the conductive crystalline grain may be controlled by adjusting the grain size of the crystalline grain forming the adhesion layer 8. The crystalline grain farthing the adhesion layer 8 may be controlled by annealing of the adhesion layer 8 similarly to the case of the conductive crystalline grain.

The median diameter D50 of the piezoelectric crystalline grain 3 may be controlled by selecting the composition of the first electrode layer 6. The median diameter D50 of the piezoelectric crystalline grain 3 may be controlled by adjusting the thickness of the first electrode layer 6. The grain size of the conductive crystalline grain may be controlled by selecting the composition of the adhesion layer 8. The grain size of the conductive crystalline grain may be controlled by adjusting the thickness of the adhesion layer 8.

For example, when the substrate 1 itself has conductivity, such as a metal plate, an n-type semiconductor, or a p-type semiconductor, the conductive layer 4 may consist of only the substrate 1, and the piezoelectric thin film 2 may be directly laminated on the surface of the substrate 1. When the piezoelectric thin film 2 is directly laminated on the surface of the substrate 1, the substrate 1 may be a polycrystal including a plurality of conductive crystalline grains, and the plurality of conductive crystalline grains may be exposed to the surface of the substrate 1. As a grain size of the conductive crystalline grain exposed to the surface of the substrate 1 increases, the grain size d of the piezoelectric crystalline grains 3 and the median diameter D50 are also likely to increase. Therefore, it is possible to control the median diameter D50 of the piezoelectric crystalline grain 3 by adjusting the grain size of the conductive crystalline grain exposed to the surface of the substrate 1. The median diameter D50 of the piezoelectric crystalline grain 3 may be controlled by selecting the composition of the substrate 1.

The median diameter of the plurality of conductive crystalline grains in the direction parallel to the surface of the conductive layer 4 may be adjusted to, for example, 30 nm or more and 80 nm or less. As a result, the median diameter D50 of the piezoelectric crystalline grain 3 is easily controlled to 30 nm or more and 80 nm or less. The median diameter of the conductive crystalline grains may be measured by analyzing the surface of the conductive layer 4 (for example, the first electrode layer 6) using the scanning electron microscope before formation of the piezoelectric thin film 2. A cross section of the conductive layer 4 (for example, the first electrode layer 6) may be formed in a direction parallel to an interface between the piezoelectric thin film 2 and the conductive layer 4 in the piezoelectric thin film device 10, and the median diameter of the conductive crystalline grains may be measured by analyzing the cross section of the conductive layer 4 using the scanning electron microscope.

As described above, the piezoelectric thin film 2 contains the piezoelectric composition having the wurtzite structure. In other words, each of the crystalline grains 3 includes the piezoelectric composition having the wurtzite structure. The piezoelectric composition having the wurtzite structure may be, for example, at least one selected from the group consisting of AlN (aluminum nitride), ZnO (zinc oxide), ZnS (zinc sulfide), ZnTe (zinc telluride), CdS (cadmium sulfide), CdSe (cadmium selenide), and CdTe (cadmium telluride). The piezoelectric thin film 2 may include a plurality of types of piezoelectric compositions. The piezoelectric thin film 2 may consist of only the piezoelectric composition having the wurtzite structure. Each of the crystalline grains 3 may consist of only the piezoelectric composition having the wurtzite structure. For example, the piezoelectric thin film 2 may be only aluminum nitride. The piezoelectric thin film 2 may be only zinc oxide.

As long as the wurtzite structure is not impaired, the above-described piezoelectric composition may include an additional element. For example, the piezoelectric thin film 2 may be aluminum nitride including an additive element. The piezoelectric thin film 2 may be zinc oxide including an additive element. The additive element may be at least one selected from the group consisting of a monovalent element, a divalent element, a trivalent element, a tetravalent element, and a pentavalent element. The monovalent element may be at least one selected from the group consisting of lithium (Li), sodium (Na), and potassium (K). The divalent element may be at least one selected from the group consisting of Mg (magnesium), Ca (calcium), Sr (strontium), and Ba (barium). The trivalent element may be at least one selected from the group consisting of Sc (scandium), Y (yttrium), and In (indium). The tetravalent element may be at least one selected from the group consisting of Ti (titanium), Zr (zirconium), and Hf (hafnium). The pentavalent element may be at least one selected from the group consisting of Cr (chromium), V (vanadium), Nb (niobium), and Ta (tantalum). The piezoelectric thin film 2 may include one or more of the above-described additive elements. When the piezoelectric thin film 2 includes the above-described additive element, a lattice constant of the wurtzite structure is easily adjusted, the crystalline grains 3 (columnar crystals) having the wurtzite structure are likely to be formed uniformly on the surface of the conductive layer 4, the median diameter D50 of the crystalline grains 3 is likely to increase, and the piezoelectric characteristics of the piezoelectric thin film 2 are easily improved. The composition of the grain boundary phase 5 is not limited. A part or all of elements included in the grain boundary phase 5 may be in common with at least one of the above-described elements included in the piezoelectric composition.

The surface of the conductive layer 4 on which the piezoelectric thin film 2 is directly laminated may have a face-centered cubic lattice structure. For example, the first electrode layer 6 may have the face-centered centered cubic lattice structure. The entire conductive layer 4 may have the face-centered cubic lattice structure. The wurtzite structure of the piezoelectric crystalline grain 3 easily matches with the face-centered cubic lattice structure. As the surface on which the piezoelectric thin film 2 is directly laminated in the conductive layer 4 has the face-centered cubic lattice structure, an absolute value of the lattice mismatch degree Δa/a is easily reduced, and the orientation of the (001) plane of the piezoelectric crystalline grain 3 is easily improved.

When the surface of the conductive layer 4 on which the piezoelectric thin film 2 is directly laminated has the face-centered cubic lattice structure, the surface of the conductive layer 4 on which the piezoelectric thin film 2 is directly laminated may be a (111) plane of the face-centered cubic lattice structure. An atomic arrangement in the (111) plane of the face-centered cubic lattice structure tends to match an atomic arrangement in the (001) plane of the wurtzite structure. As a result, the absolute value of the lattice mismatch degree Data is easily reduced, and the orientation of the (001) plane of the piezoelectric crystalline grain 3 is easily improved.

The surface of the conductive layer 4 on which the piezoelectric thin film 2 is directly laminated may have a body-centered cubic lattice structure. For example, the first electrode layer 6 may have the body-centered cubic lattice structure. The entire conductive layer 4 may have the body-centered cubic lattice structure. The wurtzite structure of the piezoelectric crystalline grain 3 easily matches with the body-centered cubic lattice structure. As the surface of the conductive layer 4 on which the piezoelectric thin film 2 is directly laminated has the body-centered cubic lattice structure, an absolute value of the lattice mismatch degree Δa/a is easily reduced, and the orientation of the (001) plane of the piezoelectric crystalline grain 3 is easily improved.

When the surface of the conductive layer 4 on which the piezoelectric thin film 2 is directly laminated has the body-centered cubic lattice structure, the surface of the conductive layer 4 on which the piezoelectric thin film 2 is directly laminated may be a (110) plane of the body-centered cubic lattice structure. An atomic arrangement in the (110) plane of the body-centered cubic lattice structure tends to match an atomic arrangement in the (001) plane of the wurtzite structure. As a result, the absolute value of the lattice mismatch degree Δa/a is easily reduced, and the orientation of the (001) plane of the piezoelectric crystalline grain 3 is easily improved.

The surface of the conductive layer 4 on which the piezoelectric thin film 2 is directly laminated may have a hexagonal close-packed structure. For example, the first electrode layer 6 may have the hexagonal close-packed structure. The entire conductive layer 4 may have the hexagonal close-packed structure. The wurtzite structure of the piezoelectric crystalline grain 3 easily matches with the hexagonal close-packed structure. As the surface of the conductive layer 4 on which the piezoelectric thin film 2 is directly laminated has the hexagonal close-packed structure, an absolute value of the lattice mismatch degree Δa/a is easily reduced, and the orientation of the (001) plane of the piezoelectric crystalline grain 3 is easily improved.

When the surface of the conductive layer 4 on which the piezoelectric thin film 2 is directly laminated has the hexagonal close-packed packed structure, the surface of the conductive layer 4 on which the piezoelectric thin film 2 is directly laminated may be a (001) plane of the hexagonal close-packed structure. An atomic arrangement in the (001) plane of the hexagonal close-packed structure tends to match an atomic arrangement in the (001) plane of the wurtzite structure. As a result, the absolute value of the lattice mismatch degree Δa/a is easily reduced, and the orientation of the (001) plane of the piezoelectric crystalline grain 3 is easily improved.

The substrate 1 may be, for example, a semiconductor substrate (a silicon substrate, a gallium arsenide substrate, or the like), an optical crystal substrate (a sapphire substrate or the like), an insulator substrate (such as a glass substrate, a ceramic substrate, or the like), or a metal substrate (a stainless steel plate or the like).

The first electrode layer 6 may include at least one element selected from the group consisting of Mo (molybdenum), W (tungsten), V (vanadium), Cr (chromium), Nb (niobium), Ta (tantalum), Ru (ruthenium), Zr (zirconium), Hf (hafnium), Ti (titanium), Y (yttrium), Sc (scandium), Mg (magnesium), Pt (platinum), Jr (iridium), Au (gold), Rh (rhodium), Pd (palladium), Ag (silver), Ni (nickel), Cu (copper), and Al (aluminum). The first electrode layer 6 may be an alloy including at least two elements selected from the above-described group. The first electrode layer 6 may be a simple substance of metal. As the first electrode layer 6 has the above-described composition, the orientation of the (001) plane of the piezoelectric crystalline grains 3 can be easily improved.

The first electrode layer 6 may be laminated directly on the surface of the substrate 1. The adhesion layer 8 may be interposed between the first electrode layer 6 and the substrate 1. The adhesion layer 8 may be at least one selected from the group consisting of Al (aluminum), Si (silicon), Ti (titanium), Zn (zinc), Y (yttrium), Zr (zirconium), Cr (chromium), Nb (niobium), Mo (molybdenum), Hf (hafnium), Ta (tantalum), W (tungsten), and Ce (cerium). The adhesion layer 8 may be a simple substance of metal, an alloy, or a compound (such as an oxide). The adhesion layer 8 may be made of another piezoelectric thin film, a polymer, or a ceramic. As the adhesion layer 8 has the above-described composition, the grain size of the conductive crystalline grain contained in the first electrode layer 6 tends to increase. In addition, the (111) plane of the face-centered cubic lattice structure of the first electrode layer 6 is likely to be oriented in the normal direction $D_N$ of the surface of the conductive layer 4 by the interposition of the adhesion layer 8. Alternatively, the (110) plane of the body-centered cubic lattice structure of the first electrode layer 6 is likely to be oriented in the normal direction $D_N$ of the surface of the conductive layer 4 by the interposition of the adhesion layer 8. Alternatively, the (001) plane of the hexagonal close-packed structure of the first electrode layer 6 is likely to be oriented in the normal direction $D_N$ of the surface of the conductive layer 4 by the interposition of the adhesion layer 8. The adhesion layer 8 also has a function of suppressing the peeling of the first electrode layer 6 caused by mechanical impact or the like. The adhesion layer 8 may be rephrased as an interface layer, a support layer, a buffer layer, or an intermediate layer.

The second electrode layer 12 may include at least one element selected from the group consisting of Mo (molybdenum), W (tungsten), V (vanadium), Cr (chromium), Nb (niobium), Ta (tantalum), Ru (ruthenium), Zr (zirconium), Hf (hafnium), Ti (titanium), Y (yttrium), Se (scandium), Mg (magnesium), Pt (platinum), Ir (iridium), Au (gold), Rh (rhodium), Pd (palladium), Ag (silver), Ni (nickel), Cu (copper), and Al (aluminum). The second electrode layer 12 may be an alloy including at least two elements selected from the above-described group. The second electrode layer 12 may be a simple substance of metal.

The thickness of the substrate 1 may be, for example, 50 μm or more and 10000 μm or less. The thickness of the adhesion layer 8 may be, for example, 0.01 μm or more and 1 μm or less. The thickness of the first electrode layer 6 may be, for example, 0.01 μm or more and 1 μm or less. The thickness of the second electrode layer 12 may be, for example, 0.01 μm or more and 1 μm or less.

The adhesion layer 8, the first electrode layer 6, the piezoelectric thin film 2, and the second electrode layer 12 may be formed in accordance with the laminating order by sputtering using at least one target. The adhesion layer 8, the first electrode layer 6, the piezoelectric thin film 2, and the second electrode layer 12 may be formed by sputtering (co-sputtering or multi-sputtering) using a plurality of targets. The target may include at least one of the elements constituting each layer or the piezoelectric thin film. It is possible to form the respective layers and the piezoelectric thin film 2 having intended compositions by selecting and combining targets having predetermined compositions. The target may be, for example, simple substance of metal, an alloy, or an oxide. The composition of the sputtering atmosphere influences the composition of each of the layers and the piezoelectric thin film 2. The sputtering atmosphere for formation of the piezoelectric thin film 2 may be, for example, a nitrogen gas. The sputtering atmosphere for formation of the piezoelectric thin film 2 may be a mixed gas including a rare gas (for example, argon) and nitrogen. The input power (power density) to be applied to each target is a control factor of the composition and thickness of each of the layers and the piezoelectric thin film 2. A total pressure of the sputtering atmosphere, a partial pressure or a concentration of a source gas (for example, nitrogen) in the atmosphere, a duration time of sputtering of each target, a temperature of the substrate surface on which the piezoelectric thin film is formed, a substrate bias, and the like are also control factors of the composition and thickness of each of the layers and the piezoelectric thin film 2. A piezoelectric thin film having a desired shape or pattern may be formed etching (for example, plasma etching).

The crystal structure of each of the adhesion layer 8, the first electrode layer 6, the piezoelectric thin film 2, and the second electrode layer 12 may be identified by an X-ray diffraction (XRD) method. The composition of each of the layers and the piezoelectric thin film 2 may be identified by at least one analysis method among X-ray fluorescence spectrometry (XRF method), energy dispersive X-ray spectrometry (EDX), inductively coupled plasma mass spectrometry (ICP-MS), laser ablation inductively coupled plasma mass spectrometry (LA-ICP-MS), and an analysis method using an electron beam micro-analyzer (SPMA).

There are diverse applications of the piezoelectric thin film device according to the present embodiment. The piezoelectric thin film device may be, for example, a piezoelectric microphone, a harvester, an oscillator, a resonator, or an acoustic multilayer film. The piezoelectric thin film device may be, for example, a piezoelectric actuator. The piezoelectric actuator may be used, for example, in a head assembly, a head stack assembly, or a hard disk drive. The piezoelectric actuator may be used, for example, in a printer head or an inkjet printer device. The piezoelectric actuator may be used in a piezoelectric switch. The piezoelectric thin film device may be, for example, a piezoelectric sensor. The piezoelectric sensor may be used, for example, in a gyro sensor, a pressure sensor, a pulse wave sensor, an ultrasonic sensor, or a shock sensor. Each of the above-described piezoelectric thin film devices may be a part or whole of MEMS.

EXAMPLES

Hereinafter, the present invention will be described in more detail with examples and comparative examples, but the present invention is not limited by these examples.

Example 1

An adhesion layer consisting of Ti was formed directly on the entire surface of a substrate by RF magnetron sputtering in a vacuum chamber. The substrate was a single crystal of silicon, and the surface of the substrate on which the adhesion layer was formed was a (100) plane of silicon. A thickness of the substrate was 625 μm. The thickness of the substrate was uniform. A thickness of the adhesion layer was 0.03 μm. The thickness of the adhesion layer was uniform. The atmosphere in the vacuum chamber was an Ar gas. A temperature of the substrate in the forming process of the adhesion layer was maintained at 300° C. A simple substance of Ti was used as a sputtering target. The input power per unit area of the sputtering target was 9.87 W/cm$^2$.

A first electrode layer (lower electrode layer) consisting of Ni was formed directly on the entire surface of the adhesion layer by RF magnetron sputtering in a vacuum chamber. A thickness of the first electrode layer was 0.3 μm. The thickness of the first electrode layer was uniform. The atmosphere in the vacuum chamber was an Ar gas. A temperature of the substrate and the adhesion layer in the forming process of the first electrode layer was maintained at 300° C. A simple substance of Al was used as a sputtering target. The input power per unit area of the sputtering target was 9.87 W/cm².

The first electrode layer was annealed at 500° C. in a vacuum chamber. The atmosphere in the vacuum chamber was a mixed gas of Ar and $N_2$. A duration time of the annealing was 10 minutes. The first electrode layer had a face-centered cubic lattice structure. A surface of the first electrode layer was a (111) plane of the face-centered cubic lattice structure.

A piezoelectric thin film was formed directly on the entire surface of the first electrode layer by RF magnetron sputtering in a vacuum chamber. The piezoelectric thin film consisted of AlN having a wurtzite structure. A thickness T of the piezoelectric thin film was 1.3 μm. The thickness of the piezoelectric thin film was uniform. The atmosphere in the vacuum chamber was a mixed gas of Ar and $N_2$. A temperature of the substrate, the adhesion layer, and the first electrode layer in the forming process of the piezoelectric thin film was maintained at 300° C. A simple substance of Al was used as a sputtering target. The input power in the RF magnetron sputtering was 9.87 W/cm².

A second electrode layer was formed directly on the entire surface of the piezoelectric thin film using the same method as in the case of the first electrode layer. A composition of the second electrode layer was exactly the same as a composition of the first electrode. A thickness of the second electrode layer was exactly the same as the thickness of the first electrode. The thickness of the second electrode layer was uniform.

As described above, a laminated body, which comprises the substrate, the adhesion layer directly laminated on the substrate, the first electrode layer directly laminated on the adhesion layer, the piezoelectric thin film directly laminated on the first electrode layer, and the second electrode directly laminated on the piezoelectric thin film, was produced. Subsequently, the laminated structure on the substrate was subjected to patterning by photolithography. Subsequently, the entire laminated body was cut by dicing to obtain a square-shaped piezoelectric thin film device of Example 1. The piezoelectric thin film device comprised the substrate, the adhesion layer directly laminated on the substrate, the first electrode layer directly laminated on the adhesion layer, the piezoelectric thin film directly laminated on the first electrode layer, and the second electrode layer directly laminated on the piezoelectric thin film. The surface of the piezoelectric thin film was parallel to the surface of the substrate and the surface of the first electrode layer. The layers consisting of the substrate, the adhesion layer directly laminated on the substrate, and the first electrode layer directly laminated on the adhesion layer corresponds to the above-described conductive layer. A normal direction of the surface of the first electrode layer corresponds to the normal direction of the surface of the conductive layer described above. A normal direction of the surface of the substrate is the same as the normal direction of the surface of the first electrode layer.

A plurality of the piezoelectric thin film devices of Example 1 were prepared for analysis and measurement which will be described later.

[Analysis of Piezoelectric Thin Film Device]

Crystal structures of the first electrode layer and the piezoelectric thin film described above were identified by an X-ray diffraction (XRD) method. A composition of each of the first electrode layer and the piezoelectric thin film was identified by X-ray fluorescence spectrometry (XRF) and laser ablation inductively coupled plasma mass spectrometry (LA-ICP-MS). For the XRD method, a multi-purpose X-ray diffractometer (SmartLab) manufactured by Rigaku Corporation was used. For the XRF, an analyzer (ZSX-100e) manufactured by Rigaku Corporation was used. For the LA-ICP-MS, an analyzer (7500s) manufactured by Agilent Technologies Inc. was used.

<Median Diameter D'50>

Figure 6:
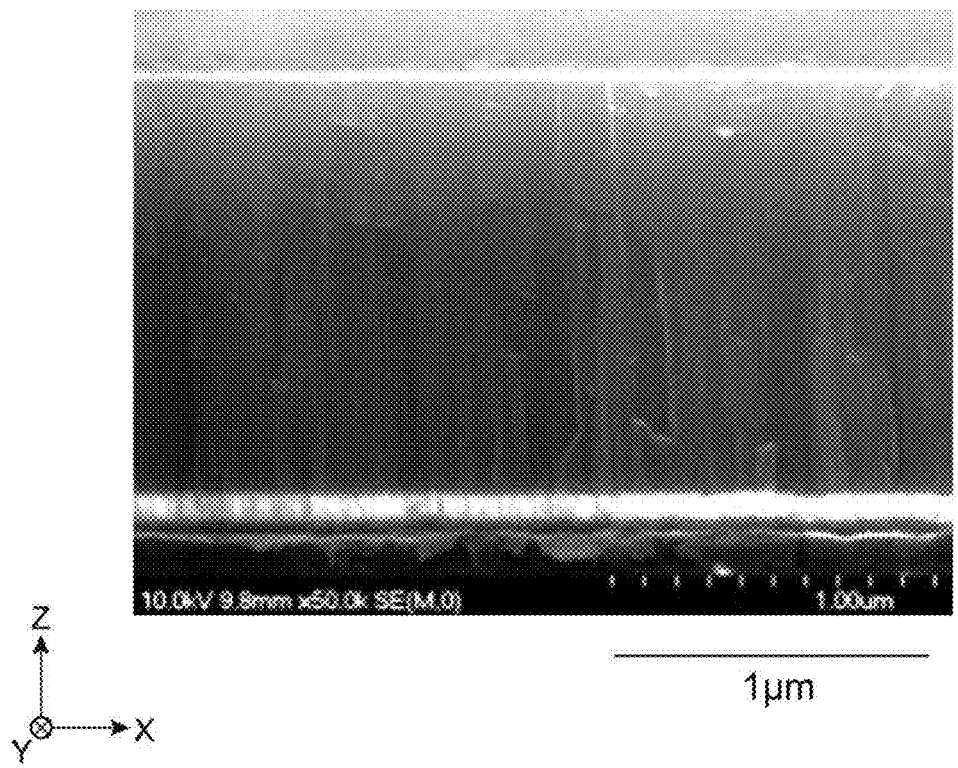
FIG. 6 is an image of a cross section of a piezoelectric thin film of Example 1, and the cross section is parallel to a normal direction of a surface of a conductive layer.

The piezoelectric thin film of Example 1 was cut in a direction perpendicular to the surface of the piezoelectric thin film to form a cross section of the piezoelectric thin film. An image of the cross section of the piezoelectric thin film taken by a scanning microscope (SEM) is shown in FIG. 6. As the SEM, S-4700 manufactured by Hitachi High-Technologies Corporation was used. As shown in FIG. 6, the piezoelectric thin film contained a large number of crystalline grains (columnar crystals) extending substantially parallel to the normal direction of the surface of the first electrode layer.

The entire surface of the piezoelectric thin film was covered with a thin film consisting of Pt in order to prevent charging. The surface of the piezoelectric thin film covered with the thin film of Pt was shot by the above-described SEM. The image of the surface of the piezoelectric thin film taken by SEM is shown in FIG. 7A. The surface of the piezoelectric thin film shown in FIG. 7A was parallel to the surface of the first electrode layer. As shown in FIG. 7A, a large number of crystalline grains (columnar crystals) were exposed to the surface of the piezoelectric thin film. Dimensions of the rectangular surface of the piezoelectric thin film shown in FIG. 7A were 880 nm long×1260 nm wide.

The image shown in FIG. 7A was manually binarized. An image of the surface of the binarized piezoelectric thin film is shown in FIG. 7B. White portions shown in FIG. 7B correspond to surfaces of the crystalline grains exposed to the surface of the piezoelectric thin film. Black portions shown in FIG. 7B correspond to grain boundary phases. The area of one closed region (white region) surrounded by the grain boundary phase was measured as the area A of the surface of one crystalline grain. The crystalline grain not clearly defined by the grain boundary phase was excluded from measuring objects of the area. An image analysis software was used to measure the area of the surface of each crystalline grain. As the image analysis software, image analysis software (not for sale) manufactured by TDK Corporation was used. As the image analysis software, Mac-View manufactured by Mountech Co., Ltd. may be used.

A grain size d (equivalent circle diameter) of each crystalline grain was calculated based on measurement value of the area A of the surface of each crystalline grain. The grain size d (diameter) of each crystalline grain is expressed by $(4A/\pi)^{1/2}$. Only the columnar crystals were selected from all the crystalline grains in the surface shown in FIG. 7B. The columnar crystal is a crystalline grain having an aspect ratio d/T of more than 0 and less than 1. T is the thickness of the piezoelectric thin film as described above. A median diameter D'50 of the columnar crystals was determined based on a grain size distribution of the grain sizes d of the columnar crystals. The median diameter D'50 of the columnar crystals of Example 1 is shown in the following Table 1.

<Orientation Direction of (001) Plane>

On the surface of the piezoelectric thin film directly laminated to the first electrode layer, $2\theta\chi\text{-}\varphi$ scan and $2\theta\chi$ scan using the above-described X-ray diffractometer were performed. The XRD patterns measured by $2\theta\chi\text{-}\varphi$ scan and $2\theta\chi$ scan showed that the piezoelectric thin film contains a plurality of crystalline grains having a wurtzite structure, and (001) planes of most of the crystalline grains were oriented in the normal direction of the surface of the conductive layer. That is, the (001) planes of most of the crystalline grains contained in the piezoelectric thin film were substantially parallel to the each surface of the substrate and the first electrode layer.

An area fraction V (unit: %) of the crystalline grain of Example 1 calculated from the measured XRD patterns is shown in the following Table 1.

<Lattice Mismatch Degree Δa/a>

A lattice mismatch degree Δa/a between the first electrode layer and the piezoelectric thin film was measured. An absolute value (unit: %) of Δa/a of Example 1 is shown in the following Table 1.

<Arithmetic Average Roughness Ra>

An arithmetic average roughness Ra (unit: nm) of the surface of the piezoelectric thin film was measured by an atomic force microscope. As the atomic force microscope, L-trace manufactured by Hitachi High-Tech Science Corporation was used. Dimensions of a rectangular region of the surface of the piezoelectric thin film scanned with the atomic force microscope were 5 μm long×5 μm wide. The arithmetic average roughness Ra of Example 1 is shown in the following Table 1.

<Residual Stress σ>

A residual stress σ (unit: MPa) in the piezoelectric thin film of Example 1 was calculated by the following procedure. First, a curvature radius $R_{Before}$ (unit: μm) of the conductive layer (that is, a laminated body consisting of the substrate, the adhesion layer, and the first electrode layer) before formation of the piezoelectric thin film was measured. Subsequently, a curvature radius $R_{After}$ (unit: μm) of the conductive layer (that is, a laminated body consisting of the substrate, the adhesion layer, the first electrode layer, and the piezoelectric thin film) after formation of the piezoelectric thin film was measured. A measurement device (P-16 profiler) manufactured by KLA-Tencor Corporation was used for measuring each of $R_{Before}$ and $R_{After}$. Then, the residual stress σ of Example 1 was calculated based on following Formula 4 (Stoney's formula). A positive residual stress σ is a tensile stress, and a negative residual stress σ is a compressive stress. The residual stress σ of Example 1 is shown in the following Table 1.

[Formula 4]

$$\sigma = \frac{1}{6} \times \left( \frac{1}{R_{after}} - \frac{1}{R_{Before}} \right) \times \frac{E}{1-v_s} \times \frac{t_{sub}^2}{t_{film}^2} \quad (4)$$

In Formula 4, E is a Young's modulus (unit: GPa) of the substrate consisting of silicon. $v_s$ is a Poisson's ratio of the substrate consisting of silicon. $t_{sub}$ (unit: μm) is the thickness of the substrate consisting of silicon. $t_{film}$ (unit: μm) is the thickness T of the piezoelectric thin film.

<Crack Rate $R_{CRACK}$>

The 100 mm×100 mm plate-like piezoelectric thin film device of Example 1 was cut to prepare 100 samples of 10 mm square. Among the 100 samples, the number n of samples in which a crack was formed in the piezoelectric thin film was counted by an optical microscope. A crack rate (that is, n %) of Example 1 is shown in the following Table 1.

<Piezoelectric Constant $d_{33}$>

A piezoelectric constant $d_{33}$ (unit: pC/N) of the piezoelectric thin film of Example 1 was measured. Details of the measurement of the piezoelectric constant $d_{33}$ were as follows. The piezoelectric constant $d_{33}$ (average value of three measurement points) of Example 1 is shown in the following Table 1.

Measurement device: $d_{33}$ piezometer (PM200) manufactured by Piezotest Pte. Ltd.

Frequency: 110 Hz

Clamping pressure: 0.25 N

<Insulation Resistivity IR>

An insulation resistivity IR (unit: Ω·cm) of the piezoelectric thin film of Example 1 was measured. A measurement device (R8340A) manufactured by ADVANTEST Corporation was used for measuring IR. In the measurement of the insulation resistivity IR, an electric field of 1 V/μm was applied to the piezoelectric thin film. The area of a portion to which the electric field was applied in each of the first electrode layer and the second electrode layer was 600×600 μm². The insulation resistivity IR of Example 1 is shown in the following Table 1.

Example 2

A first electrode layer (lower electrode layer) consisting of Cr was formed directly on the entire surface of the adhesion layer by RF magnetron sputtering in a vacuum chamber. A temperature of the substrate and the adhesion layer in the forming process of the first electrode layer was maintained at 500° C. A simple substance of Cr was used as a sputtering target.

The first electrode layer was annealed at 600° C. in a vacuum chamber. A duration time of the annealing was 10 minutes. The first electrode layer of Example 2 had a body-centered cubic lattice structure. A surface of the first electrode layer of Example 2 was a (110) plane of the body-centered cubic lattice structure.

The piezoelectric thin film device of Example 2 was prepared by the same method as in Example 1 except for the above matters. The piezoelectric thin film of Example 2 was analyzed in the same manner as in Example 1. Analysis results of Example 2 are shown in the following Table 1.

Example 3

A first electrode layer (lower electrode layer) consisting of Pt was formed directly on the entire surface of the adhesion layer by RF magnetron sputtering in a vacuum chamber. A temperature of the substrate and the adhesion layer in the forming process of the first electrode layer was maintained at 300° C. A simple substance of Pt was used as a sputtering target.

An annealing method of the first electrode layer of Example 3 was the same as that in Example 1. The first electrode layer of Example 3 had a face-centered cubic lattice structure. A surface of the first electrode layer of Example 3 was a (111) plane of the face-centered cubic lattice structure.

The piezoelectric thin film device of Example 3 was prepared by the same method as in Example 1 except for the above matters. The piezoelectric thin film of Example 3 was analyzed in the same manner as in Example 1. Analysis results of Example 3 are shown in the following Table 1.

Example 4

A first electrode layer (lower electrode layer) consisting of Ru was formed directly on the entire surface of the adhesion layer by RF magnetron sputtering in a vacuum chamber. A temperature of the substrate and the adhesion layer in the forming process of the first electrode layer was maintained at 300° C. A simple substance of Ru was used as a sputtering target.

The first electrode layer was annealed at 400° C. in a vacuum chamber. A duration time of the annealing was 10 minutes. The first electrode layer of Example 4 had a hexagonal close-packed structure. A surface of the first electrode layer of Example 4 was a (001) plane of the hexagonal close-packed structure.

The piezoelectric thin film device of Example 4 was prepared by the same method as in Example 1 except for the above matters. The piezoelectric thin film of Example 4 was analyzed in the same manner as in Example 1. Analysis results of Example 4 are shown in the following Table 1.

Example 5

A first electrode layer (lower electrode layer) consisting of $Pt_{0.7}Ni_{0.3}$ was formed directly on the entire surface of the adhesion layer by RF magnetron sputtering in a vacuum chamber. A temperature of the substrate and the adhesion layer in the forming process of the first electrode layer was maintained at 300° C. A simple substance of Pt and a simple substance of Ni were used as sputtering targets.

An annealing method of the first electrode layer of Example 5 was the same as that in Example 4. The first electrode layer of Example 5 had a face-centered cubic lattice structure. A surface of the first electrode layer of Example 5 was a (111) plane of the face-centered cubic lattice structure.

The piezoelectric thin film device of Example 5 was prepared by the same method as in Example 1 except for the above matters. The piezoelectric thin film of Example 5 was analyzed in the same manner as in Example 1. Analysis results of Example 5 are shown in the following Table 1.

Example 6

A piezoelectric thin film was formed directly on the entire surface of the first electrode layer by RF magnetron sputtering in a vacuum chamber. The piezoelectric thin film consisted of $Al_{0.75}Sc_{0.25}N$ having a wurtzite structure. A simple substance of Al and a simple substance of Sc were used as sputtering targets. A temperature of the substrate, the adhesion layer, and the first electrode layer in the forming process of the piezoelectric thin film was maintained at 300° C.

The piezoelectric thin film device of Example 6 was prepared by the same method as in Example 1 except for the above matters. The piezoelectric thin film of Example 6 was analyzed in the same manner as in Example 1. Analysis results of Example 6 are shown in the following Table 1.

Example 7

Preparation and annealing methods of a first electrode layer of Example 7 were the same as those in Example 2. A preparation method of a piezoelectric thin film of Example 7 was the same as that in Example 6.

A piezoelectric thin film device of Example 7 was prepared by the same method as in Example 1 except for the above matters. The piezoelectric thin film of Example 7 was analyzed in the same manner as in Example 1. Analysis results of Example 7 are shown in the following Table 1.

Example 8

Preparation and annealing methods of a first electrode layer of Example 8 were the same as those in Example 3. A preparation method of a piezoelectric thin film of Example 8 was the same as that in Example 6.

A piezoelectric thin film device of Example 8 was prepared by the same method as in Example 1 except for the above matters. The piezoelectric thin film of Example 8 was analyzed in the same manner as in Example 1. Analysis results of Example 8 are shown in the following Table 1.

Example 9

A first electrode layer (lower electrode layer) consisting of Zr was formed directly on the entire surface of the adhesion layer by RF magnetron sputtering in a vacuum chamber. A temperature of the substrate and the adhesion layer in the forming process of the first electrode layer was maintained at 500° C. A simple substance of Zr was used as a sputtering target.

The first electrode layer was annealed at 600° C. in a vacuum chamber. A duration time of the annealing was 10 minutes. The first electrode layer of Example 9 had a hexagonal close-packed structure. A surface of the first electrode layer of Example 9 was a (001) plane of the hexagonal close-packed structure.

A preparation method of a piezoelectric thin film of Example 9 was the same as that in Example 6.

A piezoelectric thin film device of Example 9 was prepared by the same method as in Example 1 except for the above matters. The piezoelectric thin film of Example 9 was analyzed in the same manner as in Example 1. Analysis results of Example 9 are shown in the following Table 1.

Example 10

A first electrode layer (lower electrode layer) consisting of $Nb_{0.5}Mo_{0.5}$ was formed directly on the entire surface of the adhesion layer by RF magnetron sputtering in a vacuum chamber. A temperature of the substrate and the adhesion layer in the forming process of the first electrode layer was maintained at 500° C. A simple substance of Nb and a simple substance of Mo were used as sputtering targets.

An annealing method of the first electrode layer of Example 10 was the same as that in Example 9. The first electrode layer of Example 10 had a body-centered cubic lattice structure. A surface of the first electrode layer of Example 10 was a (110) plane of the body-centered cubic lattice structure.

A preparation method of a piezoelectric thin film of Example 10 was the same as that in Example 6.

A piezoelectric thin film device of Example 10 was prepared by the same method as in Example 1 except for the above matters. The piezoelectric thin film of Example 10 was analyzed in the same manner as in Example 1. Analysis results of Example 10 are shown in the following Table 1.

Example 11

A piezoelectric thin film was formed directly on the entire surface of the first electrode layer by RF magnetron sputtering in a vacuum chamber. The piezoelectric thin film consisted of $Al_{0.75}(Mg_{0.5}Zr_{0.5})_{0.25}N$ having a wurtzite structure. A simple substance of Al, a simple substance of Mg, and a simple substance of Zr were used as sputtering targets. A temperature of the substrate, the adhesion layer, and the first electrode layer in the forming process of the piezoelectric thin film was maintained at 300° C.

A piezoelectric thin film device of Example 11 was prepared by the same method as in Example 1 except for the above matters. The piezoelectric thin film of Example 11 was analyzed in the same manner as in Example 1. Analysis results of Example 11 are shown in the following Table 1.

Example 12

Preparation and annealing methods of a first electrode layer of Example 12 were the same as those in Example 2. A preparation method of a piezoelectric thin film of Example 12 was the same as that in Example 11.

A piezoelectric thin film device of Example 12 was prepared by the same method as in Example 1 except for the above matters. The piezoelectric thin film of Example 12 was analyzed in the same manner as in Example 1. Analysis results of Example 12 are shown in the following Table 1.

Example 13

Preparation and annealing methods of a first electrode layer of Example 13 were the same as those in Example 3. A preparation method of a piezoelectric thin film of Example 13 was the same as that in Example 11.

A piezoelectric thin film device of Example 13 was prepared by the same method as in Example 1 except for the above matters. The piezoelectric thin film of Example 13 was analyzed in the same manner as in Example 1. Analysis results of Example 13 are shown in the following Table 1.

Example 14

Preparation and annealing methods of a first electrode layer of Example 14 were the same as those in Example 9. A preparation method of a piezoelectric thin film of Example 14 was the same as that in Example 11.

A piezoelectric thin film device of Example 14 was prepared by the same method as in Example 1 except for the above matters. The piezoelectric thin film of Example 14 was analyzed in the same manner as in Example 1. Analysis results of Example 14 are shown in the following Table 1.

Example 15

A first electrode layer (lower electrode layer) consisting of $W_{0.5}Mo_{0.25}Nb_{0.25}$ was formed directly on the entire surface of the adhesion layer by RF magnetron sputtering in a vacuum chamber. A temperature of the substrate and the adhesion layer in the forming process of the first electrode layer was maintained at 500° C. A simple substance of W, a simple substance of Mo, and a simple substance of Nb were used as sputtering targets.

An annealing method of the first electrode layer of Example 15 was the same as that in Example 9. The first electrode layer of Example 15 had a body-centered cubic lattice structure. A surface of the first electrode layer of Example 15 was a (110) plane of the body-centered cubic lattice structure.

A preparation method of a piezoelectric thin film of Example 15 was the same as that in Example 11.

A piezoelectric thin film device of Example 15 was prepared by the same method as in Example 1 except for the above matters. The piezoelectric thin film of Example 15 was analyzed in the same manner as in Example 1. Analysis results of Example 15 are shown in the following Table 1.

Example 16

A piezoelectric thin film was formed directly on the entire surface of the first electrode layer by RF magnetron sputtering in a vacuum chamber. The piezoelectric thin film consisted of $Al_{0.75}(Li_{0.5}Nb_{0.5})_{0.25}N$ having a wurtzite structure. An alloy consisting of Al and Li and a simple substance of Nb were used as sputtering targets. A temperature of the substrate, the adhesion layer, and the first electrode layer in the forming process of the piezoelectric thin film was maintained at 300° C.

A piezoelectric thin film device of Example 16 was prepared by the same method as in Example 1 except for the above matters. The piezoelectric thin film of Example 16 was analyzed in the same manner as in Example 1. Analysis results of Example 16 are shown in the following Table 2.

Example 17

Preparation and annealing methods of a first electrode layer of Example 17 were the same as those in Example 2. A preparation method of a piezoelectric thin film of Example 17 was the same as that in Example 16.

A piezoelectric thin film device of Example 17 was prepared by the same method as in Example 1 except for the above matters. The piezoelectric thin film of Example 17 was analyzed in the same manner as in Example 1. Analysis results of Example 17 are shown in the following Table 2.

Example 18

Preparation and annealing methods of a first electrode layer of Example 18 were the same as those in Example 3. A preparation method of a piezoelectric thin film of Example 18 was the same as that in Example 16.

A piezoelectric thin film device of Example 18 was prepared by the same method as in Example 1 except for the above matters. The piezoelectric thin film of Example 18 was analyzed in the same manner as in Example 1. Analysis results of Example 18 are shown in the following Table 2.

Example 19

A first electrode layer (lower electrode layer) consisting of Hf was formed directly on the entire surface of the adhesion layer by RF magnetron sputtering in a vacuum chamber. A temperature of the substrate and the adhesion layer in the forming process of the first electrode layer was maintained at 500° C. A simple substance of Hf was used as a sputtering target.

An annealing method of the first electrode layer of Example 19 was the same as that in Example 9. The first electrode layer of Example 19 had a hexagonal close-packed structure. A surface of the first electrode layer of Example 19 was a (001) plane of the hexagonal close-packed structure.

A preparation method of a piezoelectric thin film of Example 19 was the same as that in Example 16.

A piezoelectric thin film device of Example 19 was prepared by the same method as in Example 1 except for the above matters. The piezoelectric thin film of Example 19 was analyzed in the same manner as in Example 1. Analysis results of Example 19 are shown in the following Table 2.

Example 20

A first electrode layer (lower electrode layer) consisting of $W_{0.8}Mo_{0.1}V_{0.1}$ was formed directly on the entire surface of the adhesion layer by RF magnetron sputtering in a vacuum chamber. A temperature of the substrate and the adhesion layer in the forming process of the first electrode layer was maintained at 500° C. A simple substance of W, a simple substance of Mo, and a simple substance of V were used as sputtering targets.

An annealing method of the first electrode layer of Example 20 was the same as that in Example 9. The first electrode layer of Example 20 had a body-centered cubic lattice structure. A surface of the first electrode layer of Example 20 was a (110) plane of the body-centered cubic lattice structure.

A preparation method of a piezoelectric thin film of Example 20 was the same as that in Example 16.

A piezoelectric thin film device of Example 20 was prepared by the same method as in Example 1 except for the above matters. The piezoelectric thin film of Example 20 was analyzed in the same manner as in Example 1. Analysis results of Example 20 are shown in the following Table 2.

Example 21

Preparation and annealing methods of a first electrode layer of Example 21 were the same as those in Example 3.

A piezoelectric thin film was formed directly on the entire surface of the first electrode layer by RF magnetron sputtering in a vacuum chamber. The piezoelectric thin film consisted of ZnO having a wurtzite structure. ZnO was used as a sputtering target. The atmosphere in the vacuum chamber was a mixed gas of Ar and $O_2$. A temperature of the substrate, the adhesion layer, and the first electrode layer in the forming process of the piezoelectric thin film was maintained at 300° C.

A piezoelectric thin film device of Example 21 was prepared by the same method as in Example 1 except for the above matters. The piezoelectric thin film of Example 21 was analyzed in the same manner as in Example 1. Analysis results of Example 21 are shown in the following Table 2.

Example 22

Preparation and annealing methods of a first electrode layer of Example 22 were the same as those in Example 9. A preparation method of a piezoelectric thin film of Example 22 was the same as that in Example 21.

A piezoelectric thin film device of Example 22 was prepared by the same method as in Example 1 except for the above matters. The piezoelectric thin film of Example 22 was analyzed in the same manner as in Example 1. Analysis results of Example 22 are shown in the following Table 2.

Example 23

A first electrode layer (lower electrode layer) consisting of Mo was formed directly on the entire surface of the adhesion layer by RF magnetron sputtering in a vacuum chamber. A temperature of the substrate and the adhesion layer in the forming process of the first electrode layer was maintained at 500° C. A simple substance of Mo was used as a sputtering target.

An annealing method of the first electrode layer of Example 23 was the same as that in Example 2.

A piezoelectric thin film was formed directly on the entire surface of the first electrode layer by RF magnetron sputtering in a vacuum chamber. The piezoelectric thin film consisted of $Zn_{0.75}Mg_{0.25}O$ having a wurtzite structure. ZnO and MgO were used as sputtering targets. The atmosphere in the vacuum chamber was a mixed gas of Ar and $O_2$. A temperature of the substrate, the adhesion layer, and the first electrode layer in the forming process of the piezoelectric thin film was maintained at 300° C.

A piezoelectric thin film device of Example 23 was prepared by the same method as in Example 1 except for the above matters. The piezoelectric thin film of Example 23 was analyzed in the same manner as in Example 1. Analysis results of Example 23 are shown in the following Table 2.

Comparative Example 1

A first electrode layer of Comparative Example 1 was not annealed before a piezoelectric thin film was formed.

A piezoelectric thin film device of Comparative Example 1 was prepared by the same method as in Example 3 except for the above matters. The piezoelectric thin film of Comparative Example 1 was analyzed in the same manner as in Example 1. Analysis results of Comparative Example 1 are shown in the following Table 2. However, the piezoelectric thin film of Comparative Example 1 had conductivity, and it was difficult to measure an insulation resistivity IR of Comparative Example 1.

Comparative Example 2

A first electrode layer of Comparative Example 2 was not annealed before a piezoelectric thin film was formed.

A piezoelectric thin film device of Comparative Example 2 was prepared by the same method as in Example 8 except for the above matters. The piezoelectric thin film of Comparative Example 2 was analyzed in the same manner as in Example 1. Analysis results of Comparative Example 2 are shown in the following Table 2.

Comparative Example 3

A first electrode layer of Comparative Example 3 was not annealed before a piezoelectric thin film was formed.

A piezoelectric thin film device of Comparative Example 3 was prepared by the same method as in Example 21 except for the above matters. The piezoelectric thin film of Comparative Example 3 was analyzed in the same manner as in Example 1. Analysis results of Comparative Example 3 are shown in the following Table 2. However, the piezoelectric thin film of Comparative Example 3 had conductivity, and it was difficult to measure an insulation resistivity IR of Comparative Example 3.

Comparative Example 4

A preparation method of a first electrode layer of Comparative Example 4 was the same as that in Example 3. A preparation method of a piezoelectric thin film of Comparative Example 4 was the same as that in Example 23. However, the first electrode layer of Comparative Example 4 was not annealed before formation of the piezoelectric thin film.

A piezoelectric thin film device of Comparative Example 4 was prepared by the same method as in Example 1 except for the above matters. The piezoelectric thin film of Comparative Example 4 was analyzed in the same manner as in Example 1. Analysis results of Comparative Example 4 are shown in the following Table 2.

In all the cases of the above-described examples and comparative examples, the piezoelectric thin film contained the plurality of crystalline grains having the wurtzite structure, and the (001) planes of most of the crystalline grains were oriented in the normal direction of the surface of the first electrode layer. That is, the (001) planes of most of the crystalline grains contained in the piezoelectric thin film were substantially parallel to the surfaces of the substrate and the first electrode layer.

The unit of numerical values in each composition formula of the piezoelectric thin film and the first electrode layer shown in Table 1 and Table 2 is molar. It is preferable that the absolute value of the residual stress σ is small, and a target value of the absolute value of 6 is 900 MPa or less. It is preferable that the crack rate $R_{CRACK}$ is low, and a target value of $R_{CRACK}$ is 1% or less. It is preferable that the piezoelectric constant $d_{33}$ is large, and a target value of $d_{33}$ is 6.0 pC/N or more. It is preferable that the insulation resistivity IR is high, and a target value of IR is $10^{13}$ Ω·cm or more. Quality A described in Table 1 and Table 2 means that all the four values of σ, $R_{CRACK}$, $d_{33}$, and IR achieve the above-described target values. Quality B described in Table 1 and Table 2 means that three out of the four values of σ, $R_{CRACK}$, $d_{33}$, and IR achieve the above-described target values. Quality C described in Table 1 and Table 2 means that two out of the four values of σ, $R_{CRACK}$, $d_{33}$, and IR achieve the above-described target values. Quality D described in Tables 1 and Table 2 means that all the four values of σ, $R_{CRACK}$, $d_{33}$, and IR do not achieve the above-described target values.

INDUSTRIAL APPLICABILITY

According to the present invention, provided is the piezoelectric thin film device with the reduced residual stress of the piezoelectric thin film.

REFERENCE SIGNS LIST

1: substrate; 2: piezoelectric thin film; 2s: surface of piezoelectric thin film; 3, 3a, 3b: crystalline grain having wurtzite structure; 3s: surface of crystalline grain exposed to surface of piezoelectric thin film; 4: conductive layer; 5: grain boundary phase; 6: first electrode layer; 6a, 6b: conductive crystalline grain; 8: adhesion layer 10, 10a: piezoelectric thin film device; $E^α$, $E^β$: element included in wurtzite structure; T: thickness of piezoelectric thin film; d: grain size (diameter) of crystalline grain in direction parallel to surface of conductive layer; $D_N$: normal direction of surface of conductive layer; $d_n$: normal direction of surface of piezoelectric thin film; g: grain size distribution of crystalline grains; uc: unit cell of wurtzite structure.

What is claimed is:

1. A piezoelectric thin film device comprising:
a conductive layer; and
a piezoelectric thin film directly laminated on a surface of the conductive layer, wherein
the piezoelectric thin film contains a plurality of crystalline grains having a wurtzite structure,
a (001) plane of at least a part of the crystalline grains is oriented in a normal direction of the surface of the conductive layer, and
a median diameter of the plurality of the crystalline grains in a direction parallel to the surface of the conductive layer is 30 nm or more and 80 nm or less.

TABLE 1

| Unit | Piezoelectric Thin Film — | First Electrode Layer — | D'50 [nm] | V [%] | Δa/a [%] | Ra [nm] | σ [MPa] | $R_{CRACK}$ [%] | $d_{33}$ [pC/N] | IR [Ω · cm] | Quality — |
|---|---|---|---|---|---|---|---|---|---|---|---|
| Example 1 | AlN | Ni | 51 | 75 | 7.7 | 8.4 | 400 | 1 | 3.8 | 10^8 | C |
| Example 2 | AlN | Cr | 70 | 90 | 7.9 | 6.9 | −113 | 0 | 6.2 | 10^10 | B |
| Example 3 | AlN | Pt | 59 | 95 | 3.1 | 5.2 | 51 | 0 | 5.5 | 10^13 | B |
| Example 4 | AlN | Ru | 53 | 96 | 0.3 | 5.1 | 100 | 0 | 6.1 | 10^12 | B |
| Example 5 | AlN | $Ft_{0.7}Ni_{0.3}$ | 42 | 99 | 0.1 | 3.8 | 158 | 0 | 7.0 | 10^14 | A |
| Example 6 | $Al_{0.75}Sc_{0.25}N$ | Ni | 44 | 71 | 11.6 | 9.1 | 203 | 0 | 5.2 | 10^7 | C |
| Example 7 | $Al_{0.75}Sc_{0.25}N$ | Cr | 55 | 92 | 11.8 | 8.9 | −50 | 1 | 10.3 | 10^9 | B |
| Example 8 | $Al_{0.75}Sc_{0.25}N$ | Pt | 52 | 96 | 0.5 | 7.0 | 200 | 1 | 12.1 | 10^12 | B |
| Example 9 | $Al_{0.75}Sc_{0.25}N$ | Zr | 56 | 97 | 0.3 | 5.2 | 149 | 0 | 12.5 | 10^12 | B |
| Example 10 | $Al_{0.75}Sc_{0.25}N$ | $Nb_{0.5}Mo_{0.5}$ | 61 | 100 | 0.0 | 1.9 | −314 | 0 | 13.5 | 10^13 | A |
| Example 11 | $Al_{0.75}(Mg_{0.5}Zr_{0.5})_{0.25}N$ | Ni | 41 | 67 | 11.1 | 7.1 | 305 | 1 | 4.9 | 10^10 | C |
| Example 12 | $Al_{0.75}(Mg_{0.5}Zr_{0.5})_{0.25}N$ | Cr | 48 | 94 | 11.3 | 8.3 | 118 | 0 | 10.4 | 10^9 | B |
| Example 13 | $Al_{0.75}(Mg_{0.5}Zr_{0.5})_{0.25}N$ | Pt | 56 | 93 | 0.1 | 5.7 | −403 | 0 | 12.8 | 10^12 | B |
| Example 14 | $Al_{0.75}(Mg_{0.5}Zr_{0.5})_{0.25}N$ | Zr | 55 | 94 | 0.8 | 6.0 | −530 | 0 | 13.1 | 10^12 | B |
| Example 15 | $Al_{0.75}(Mg_{0.5}Zr_{0.5})_{0.25}N$ | $W_{0.5}Mo_{0.25}Nb_{0.25}$ | 53 | 97 | 0.1 | 3.4 | 39 | 0 | 11.8 | 10^14 | A |

TABLE 2

| Unit | Piezoelectric Thin Film — | First Electrode Layer — | D'50 [nm] | V [%] | Δa/a [%] | Ra [nm] | σ [M.Pa] | $R_{CRACK}$ [%] | $d_{33}$ [pC/N] | IR [Ω · cm] | Quality — |
|---|---|---|---|---|---|---|---|---|---|---|---|
| Example 16 | $Al_{0.75}(Li_{0.5}Nb_{0.5})_{0.25}N$ | Ni | 35 | 92 | 9.8 | 6.8 | 627 | 1 | 4.2 | 10^9 | C |
| Example 17 | $Al_{0.75}(Li_{0.5}Nb_{0.5})_{0.25}N$ | Cr | 40 | 95 | 10.0 | 7.0 | 399 | 1 | 9.1 | 10^10 | B |
| Example 18 | $Al_{0.75}(Li_{0.5}Nb_{0.5})_{0.25}N$ | Pt | 43 | 95 | 1.1 | 5.3 | 180 | 0 | 10.0 | 10^13 | B |
| Example 19 | $Al_{0.75}(Li_{0.5}Nb_{0.5})_{0.25}N$ | Hf | 43 | 96 | 0.8 | 5.1 | 138 | 0 | 10.2 | 10^12 | B |
| Example 20 | $Al_{0.75}(Li_{0.5}Nb_{0.5})_{0.25}N$ | $W_{0.8}Mo_{0.1}V_{0.1}$ | 49 | 98 | 0.1 | 1.4 | −124 | 0 | 9.8 | 10^14 | A |
| Example 21 | ZnO | Pt | 40 | 93 | 1.4 | 5.7 | 211 | 0 | 9.1 | 10^10 | B |
| Example 22 | ZnO | Zr | 41 | 95 | 0.6 | 5.2 | 205 | 0 | 9.6 | 10^10 | B |
| Example 23 | $Zn_{0.75}Mg_{0.25}O$ | Mo | 37 | 91 | 3.4 | 4.4 | 528 | 1 | 14.0 | 10^13 | A |
| Comparative Example 1 | AlN | Pt | 25 | 85 | 3.1 | 6.1 | 1311 | 10 | 0 | — | D |
| Comparative Example 2 | $Al_{0.75}Sc_{0.25}N$ | Pt | 21 | 71 | 0.5 | 7.0 | 1183 | 7 | 0 | 10^6 | D |
| Comparative Example 3 | ZnO | Pt | 23 | 83 | 1.4 | 6.6 | 1245 | 8 | 0 | — | D |
| Comparative Example 4 | $Zn_{0.75}Mg_{0.25}O$ | Pt | 22 | 66 | 3.4 | 5.3 | 997 | 5 | 0 | 10^8 | D |

2. The piezoelectric thin film device according to claim 1, wherein
at least a part of the crystalline grains is a columnar crystal extending along the normal direction of the surface of the conductive layer.

3. The piezoelectric thin film device according to claim 1, wherein
an area fraction V of the crystalline grains is defined by the following Formula 1,
h, k, and l in the following Formula 1 are Miller indices of the wurtzite structure,
$\Sigma I_{(h00)}$ in the following Formula 1 is a sum of intensities $I_{(h00)}$ of diffracted X-rays derived from a (h00) plane of the wurtzite structure,
$\Sigma I_{(hk0)}$ in the following Formula 1 is a sum of intensities $I_{(hk0)}$ of diffracted X-rays derived from a (hk0) plane of the wurtzite structure,
$\Sigma I_{(hkl)}$ in the following Formula 1 is a sum of intensities of diffracted X-rays derived from all crystal planes of the wurtzite structure,
$I_{(h00)}$, $I_{(hk0)}$, and $I_{(hkl)}$ in the following Formula 1 are intensities of in-plane diffracted X-rays of a surface of the piezoelectric thin film,
the surface of the piezoelectric thin film is parallel to the surface of the conductive layer, and
the area fraction V is 90% or more and 00% or less.

[Formula 1]
$$V = \left(2 \times \frac{\Sigma I_{(h00)} + \Sigma I_{(hk0)}}{\Sigma I_{(hkl)}} - 1\right) \times 100 \quad (1)$$

4. The piezoelectric thin film device according to claim 1, wherein
an absolute value of a lattice mismatch degree between the conductive layer and the piezoelectric thin film is 0% or more and 6% or less.

5. The piezoelectric thin film device according to claim 1, wherein
an arithmetic average roughness Ra of the surface of the piezoelectric thin film is 0.1 nm or more and 5.0 nm or less.

6. The piezoelectric thin film device according to claim 1, wherein
the piezoelectric thin film is only aluminum nitride or aluminum nitride including an additive element.

7. The piezoelectric thin film device according to claim 1, wherein
the piezoelectric thin film is only zinc oxide or zinc oxide including an additive element.

8. The piezoelectric thin film device according to claim 1, wherein
the conductive layer contains a plurality of conductive crystalline grains, and
the crystalline grain contained in the piezoelectric thin film is formed on a surface of the conductive crystalline grain.

* * * * *